(12) United States Patent
Hisamoto et al.

(10) Patent No.: US 10,818,679 B2
(45) Date of Patent: Oct. 27, 2020

(54) SEMICONDUCTOR DEVICE AND METHOD OF MANUFACTURING THE SAME

(71) Applicant: RENESAS ELECTRONICS CORPORATION, Tokyo (JP)

(72) Inventors: Digh Hisamoto, Tokyo (JP); Yoshiyuki Kawashima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/460,476

(22) Filed: Jul. 2, 2019

(65) Prior Publication Data
US 2020/0035693 A1     Jan. 30, 2020

(30) Foreign Application Priority Data
Jul. 27, 2018 (JP) .................... 2018-141095

(51) Int. Cl.
*H01L 27/11521* (2017.01)
*H01L 21/8234* (2006.01)
*H01L 27/1158* (2017.01)
*H01L 27/11565* (2017.01)
*H01L 27/11568* (2017.01)

(52) U.S. Cl.
CPC ........... *H01L 27/11521* (2013.01); *H01L 21/823431* (2013.01); *H01L 27/1158* (2013.01); *H01L 27/11565* (2013.01); *H01L 27/11568* (2013.01)

(58) Field of Classification Search
CPC ......... H01L 21/823431; H01L 27/0886; H01L 29/41791; H01L 29/785–7853; H01L 29/7855; H01L 29/792; H01L 29/4234–42348; H01L 29/66833; G11C 16/0466–0475; G11C 27/005; G11C 11/5671
See application file for complete search history.

(56) References Cited

U.S. PATENT DOCUMENTS

2017/0062445 A1*   3/2017   Yamashita ...... H01L 21/823431

OTHER PUBLICATIONS

D. Hisamoto, et al., "FinFET—A Self-Aligned Double-Gate MOSFET Scalable to 20 nm," IEEE Trans. Electron Devices, vol. 47, No. 12, pp. 2320-2325, 2000.

S. Tsuda, et al., "First Demonstration of FinFET Split-Gate MONOS for High-Speed and Highly-Reliable Embedded Flash in 16/14nm-node and beyond," IEDM Tech. Dig., pp. 280-283, 2016.

* cited by examiner

*Primary Examiner* — Jose R Diaz
(74) *Attorney, Agent, or Firm* — McDermott Will & Emery LLP

(57) ABSTRACT

In a MONOS memory of the split-gate type formed by a field effect transistor formed on a fin, it is prevented that the rewrite lifetime of the MONOS memory is reduced due to charges being locally transferred into and out of an ONO film in the vicinity of the top of the fin by repeating the write operation and the erase operation. By forming a source region at a position spaced downward from a first upper surface of the fin in a region directly below a memory gate electrode, the current is prevented from flowing concentratedly at the upper end of the fin.

15 Claims, 35 Drawing Sheets

FIG. 04

|  | Vbl | Vwl | Vmg | Vsl | Vb |
|---|---|---|---|---|---|
| ERASE | 0 | 0 | -5 | 5 | 0 |
| WRITE | 0/1.5 | 0.5 | 10 | 5 | 0 |
| READ | 1.5 | 1.5 | 0 | 0 | 0 |

FIG. 07
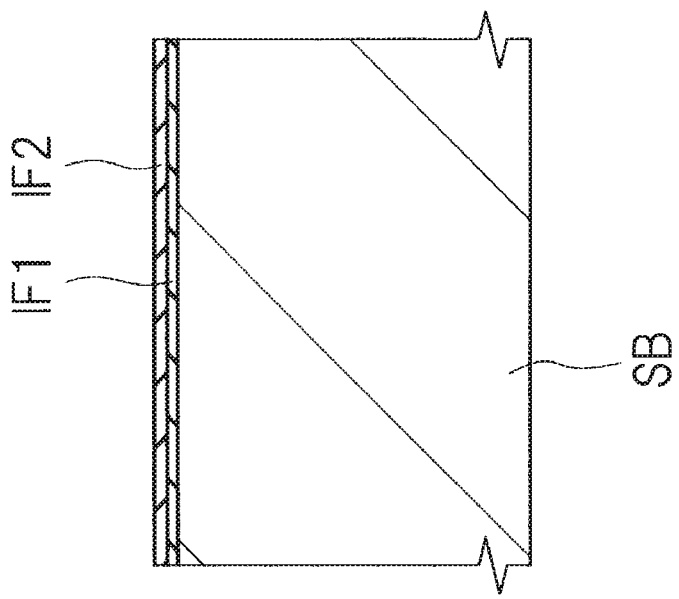
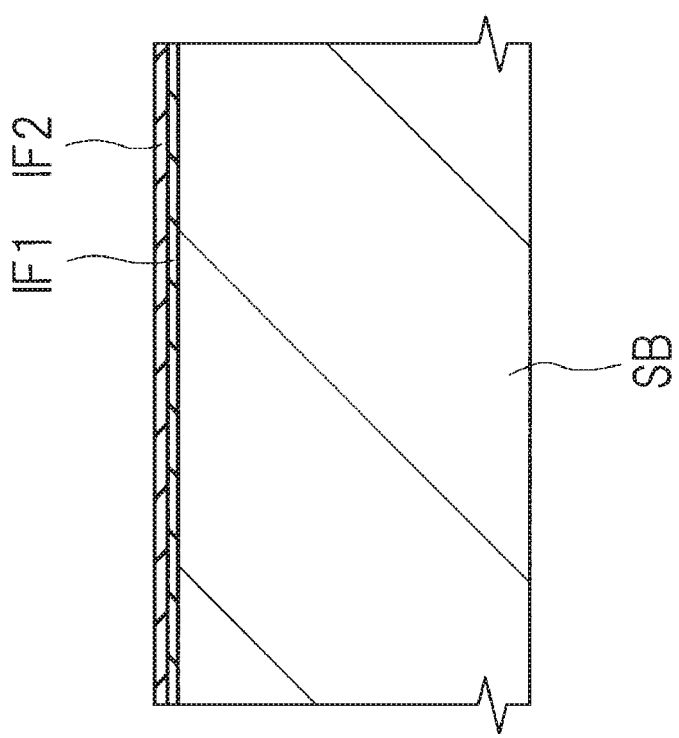

FIG. 26
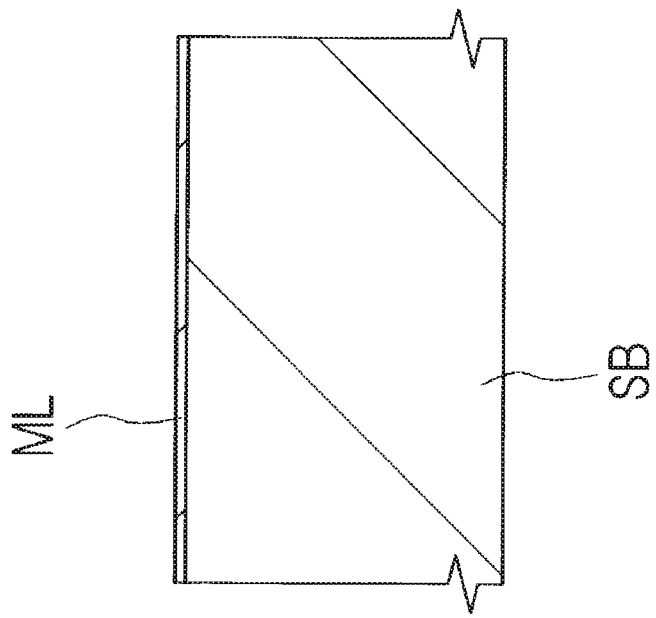
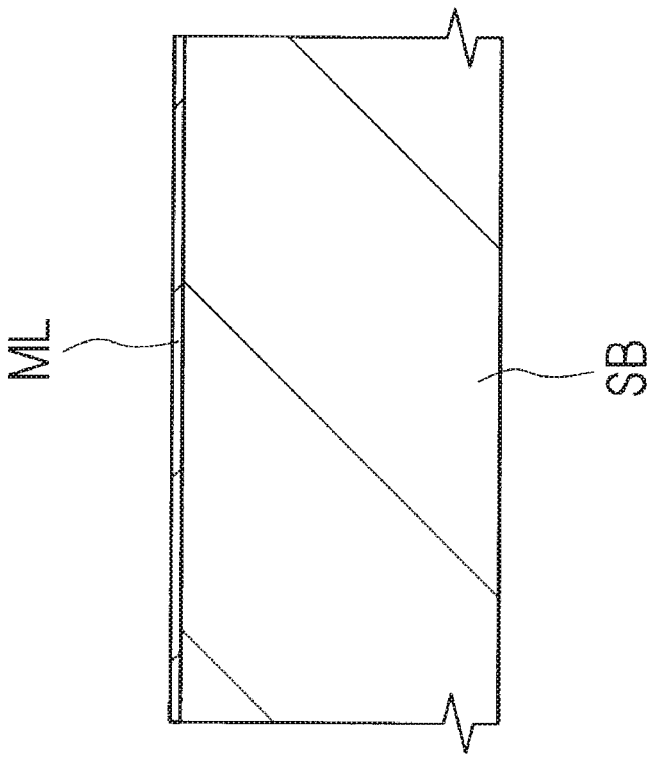

SEMICONDUCTOR DEVICE AND METHOD OF MANUFACTURING THE SAME

CROSS-REFERENCE TO RELATED APPLICATIONS

The disclosure of Japanese Patent Application No. 2018-141095 filed on Jul. 27, 2018 including the specification, drawings and abstract is incorporated herein by reference in its entirety.

BACKGROUND

The present invention relates to a semiconductor device and a method of manufacturing the same, and more particularly, the present invention relates to a semiconductor device and a method of manufacturing the same having a MONOS memory of a split-gate type constituted by a FINFET.

As one of the nonvolatile memories, there has been known a Metal Oxide Nitride Oxide Semiconductor (MONOS) memory which has a Field Effect Transistor (FET) structure and stores data by storing charges in an Oxide Nitride Oxide (ONO) film formed between a gate electrode and a substrate. The MONOS memory includes a split-gate type nonvolatile memory having a control gate electrode used for selecting a memory cell and a memory gate electrode formed adjacently to the control gate electrode via an insulating film and used for storing data.

In addition, fin-type transistor is known as a field effect transistor which operate at high speed and which can reduce leakage current, consume power, and miniaturize device. The fin-type transistor (FINFET) is, for example, a semiconductor device having a pattern of plate-like (wall-like) semiconductor layer protruded above the substrate as channel region, and having a gate electrode formed so as to straddle the channel region on the pattern.

Non-Patent Document 1 "D. Hisamoto, et al., "FinFET-A Self-aligned Double-gate MOSFET Scalable to 20 nm," IEEE Trans. Electron Devices, vol. 47, no. 12, pp. 2320-2325, 2000." and Non-Patent Document 2 "S. Tsuda, et al., "First demonstration of FinFET split-gate MONOS for high-speed and highly-reliable embedded flash in 16/14 nm-node and beyond," IEDM Tech. Dig., pp. 280-283, 2016." describe split-gate type flash memories constituted by a FINFET.

SUMMARY

In the MONOS memory of the split-gate type, writing is performed by applying a high voltage to the memory gate electrode at the time of writing and injecting electrons into the ONO film, and erasing is performed by applying a negative voltage to the memory gate electrode at the time of erasing and injecting holes into the ONO film. At the time of writing in the MONOS memory formed by the FINFET, electric current concentrates on the upper portion of the fin, so that charges are injected into the ONO film locally in the vicinity of the upper portion of the fin. As a result, there arise problems of deterioration of rewrite durability and deterioration of retention characteristics of the MONOS memory.

Other objects and novel features will be apparent from the description of the specification and the accompanying drawings.

The typical ones of the embodiments disclosed in the present application will be briefly described as follows.

In the semiconductor device according to the embodiments, in the MONOS memory of the split-gate type constituted by the field effect transistor formed on the fin, the semiconductor region on the memory gate electrode side is formed at a position spaced downward from the first upper surface of the fin directly below the memory gate electrode.

According to the embodiments disclosed in the present application, the performance of the semiconductor device can be improved. In particular, the rewrite lifetime of the memory can be extended.

BRIEF DESCRIPTION OF THE DRAWINGS

FIG. 4 is a table showing an example of application conditions of voltages to the respective portions of the selected memory cell at the time of "write", "erase" and "read".

FIG. 7 is a cross-sectional view during a manufacturing step of the semiconductor device according to the first embodiment.

FIG. 26 is a cross-sectional view during the manufacturing step of a semiconductor device according to modification of the second embodiment.

DETAILED DESCRIPTION

Figure 1:
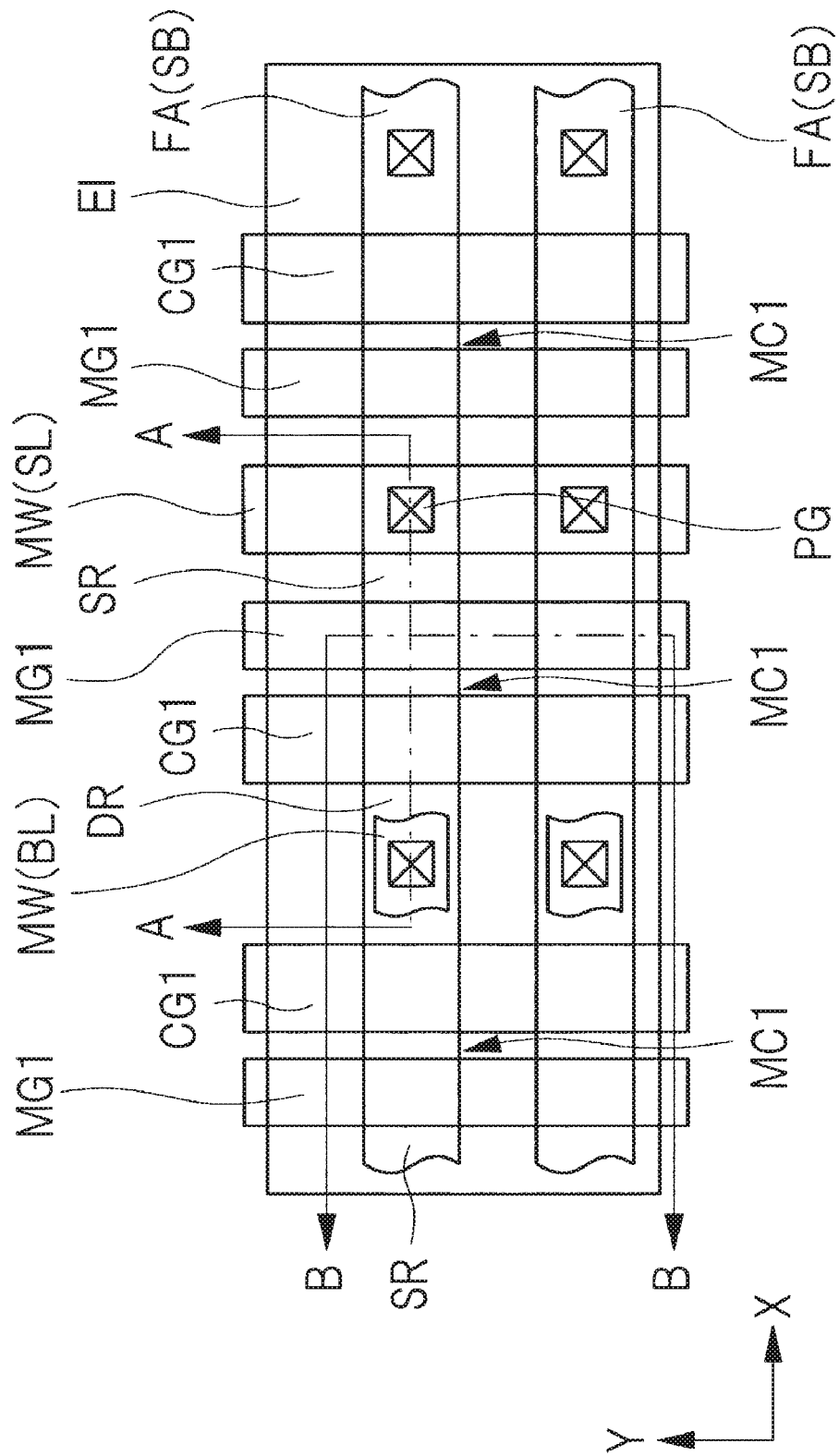
FIG. 1 is a plan view of a semiconductor device according to first embodiment.

In the following embodiments, when required for convenience, the description will be made by dividing into a plurality of sections or embodiments, but except when specifically stated, they are not independent of each other, and one is related to the modification, detail, supplementary description, or the like of part or all of the other. In addition, in the following embodiments, the number of elements or the like (including the number, numerical values, the amount, the range, and the like) is not limited to the mentioned number, except the case where it is specified in particular or the case where it is obviously limited to a specific number in principle, and may be equal to or more than the mentioned number or may be equal to or less than the mentioned number.

Furthermore, in the following embodiments, the components (including element steps and the like) are not necessarily essential except for the case in which they are specifically specified, the case in which they are considered to be obviously essential in principle, and the like. Similarly, in the following embodiments, when referring to the shapes of components and the like, and positional relationships and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Hereinafter, embodiments will be described in detail based on the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary. In the drawings for explaining the embodiments, hatching may be applied to a plan view, a perspective view, or the like in order to facilitate understanding of the structure.

First Embodiment

A semiconductor device according to the first embodiment is characterized mainly by having a MONOS memory having a control gate electrode and a memory gate electrode formed side by side on a fin which is a part of a semiconductor substrate, and a source region spaced apart from an upper surface of the fin directly below the memory gate electrode. Here, it will be described that an ONO film covering the upper surface of the fin and the source region are spaced apart from each other to prevent charges from being injected locally at the upper portion of the fin where the electric field and the current tend to concentrate, thereby preventing deterioration of write durability of a memory.

However, in this specification, a semiconductor region formed in the upper portion of the semiconductor substrate on the memory gate electrode side is referred to as the source region, and a semiconductor region formed in the upper portion of the semiconductor substrate on the control gate electrode side is referred to as the drain region. That is, a transistor has a source region, which is a semiconductor region on the electron supply side, and a drain region, which is a semiconductor region on the electron reception side. In a transistor included in the MONOS memory described in the present application, there are cases where the semiconductor region on the memory gate electrode side acts as a source and the semiconductor region on the control gate electrode side acts as a drain, and cases where the semiconductor region on the memory gate electrode side acts as a drain and the semiconductor region on the control gate electrode side acts as a source, by operations. Therefore, the semiconductor region described as a source region in the following description is a region which can also function as a drain, and the semiconductor region described as a drain region in the following description is a region which can also function as a source.

That is, a pair of semiconductor regions constituting the source/drain regions is formed in the semiconductor substrate so as to sandwich a pattern formed of the control gate electrode and the memory gate electrode. That is, each of the pair of semiconductor regions is a semiconductor region for a source or a drain. Hereinafter, in order to make a structure of the MONOS memory easy to understand, one of the pair of semiconductor regions is referred to as a source region, and the other of the pair of semiconductor regions is referred to as a drain region, following the roles of the pair of semiconductor regions in a predetermined operation.

Structure of Semiconductor Device

Figure 2:
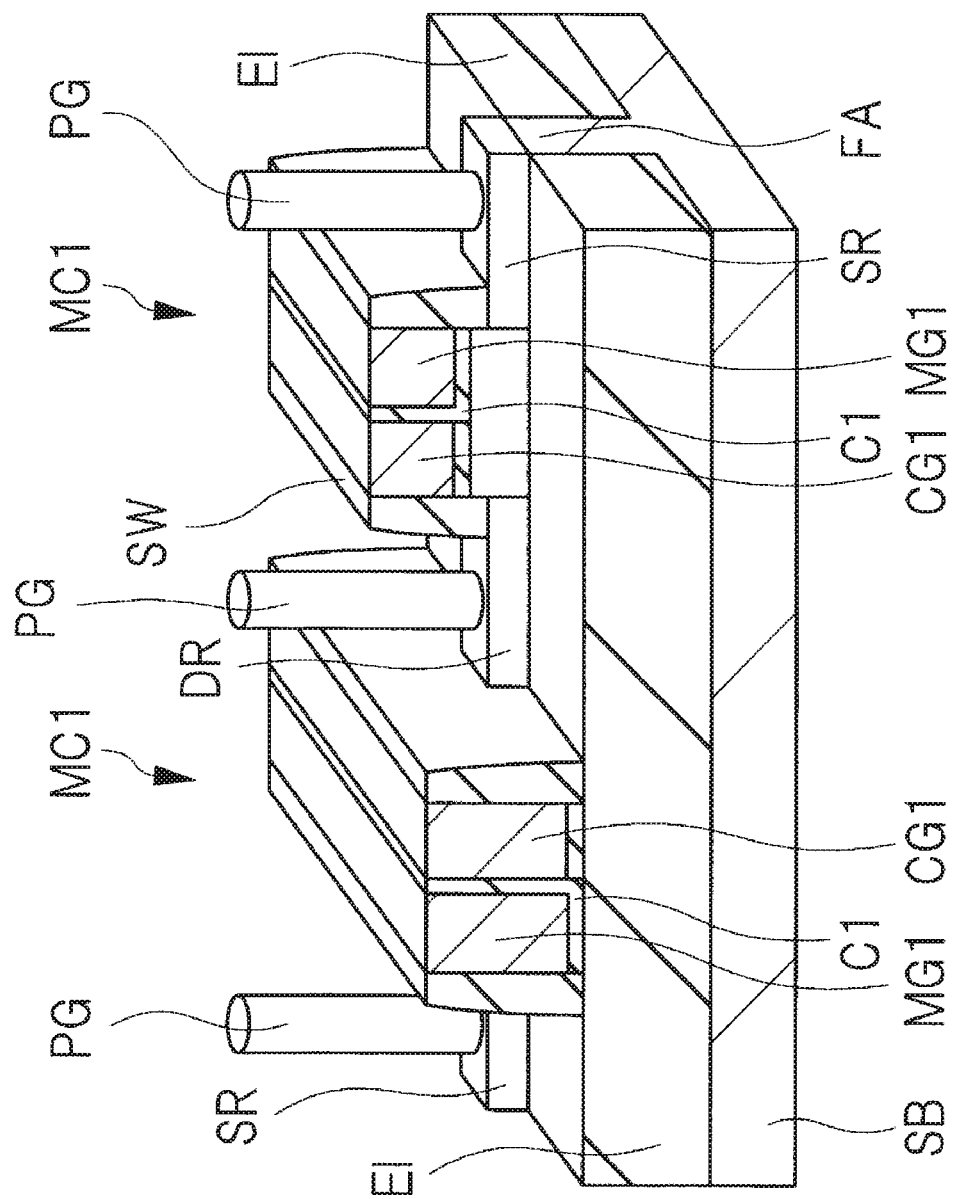
FIG. 2 is a perspective view of the semiconductor device according to the first embodiment.
Figure 3:
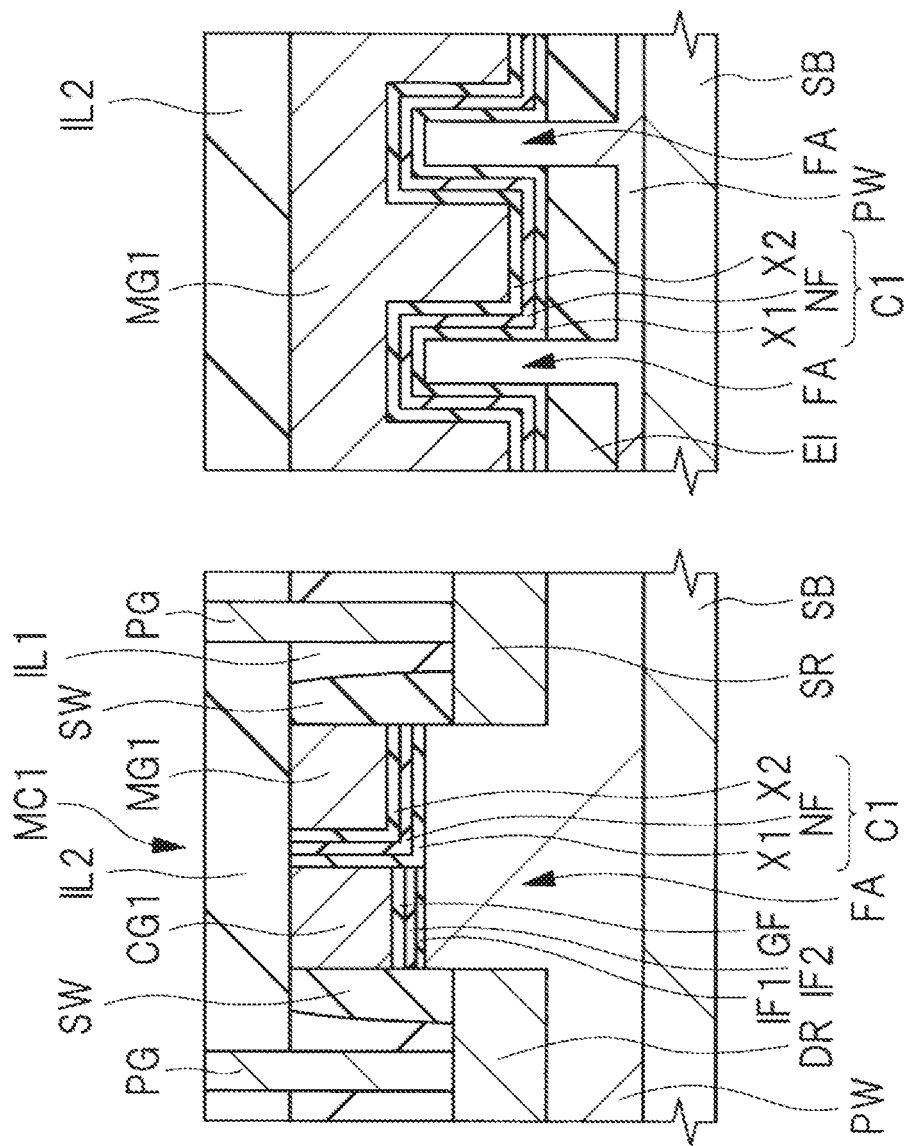
FIG. 3 is a cross-sectional view of the semiconductor device according to the first embodiment.

Hereinafter, a structure of the semiconductor device according to the present embodiment will be described with reference to FIGS. 1 to 3. FIG. 1 is a plan view of the semiconductor device in the present embodiment. FIG. 2 is a perspective view of the semiconductor device in the present embodiment. FIG. 3 is a cross-sectional view of the semiconductor device in the present embodiment. In FIG. 2, a well, an interlayer insulating film, a silicide layer, and a wiring are not shown. In FIG. 3, a silicide layer and a wiring are not shown.

The left side of FIG. 3 shows a cross-section taken along line A-A of FIG. 1, and the right side of FIG. 3 shows a cross-section taken along line B-B of FIG. 1. That is, in FIG. 3, a cross section along a gate length direction (X direction) of a transistor constituting a memory cell and a cross section including a memory gate electrode along a gate width direction (Y direction) of the transistor constituting the memory cell are alternately arranged in order from the left side to the right side.

FIG. 1 shows a plan view of a memory array. Each of the plurality of memory cells MC1 formed in the memory array is a nonvolatile memory element. Hereinafter, a region in which a memory cell is formed is referred to as a memory cell region.

In the memory cell region, a plurality of fins FA extending in the X direction are arranged at equal intervals in the Y direction. The X direction and the Y direction are directions along the upper surface (main surface) of the semiconductor substrate SB (see FIG. 2), and the X direction is orthogonal to the Y direction. The fins FA are, for example, rectangular parallelepiped protruding portions (projections) selectively protruded from the upper surface (main surface) of the semiconductor substrate SB, and have a wall-like (plate-like) shape. The fins FA are part of the semiconductor substrate SB and constitute active regions of the semiconductor substrate SB. In plan view, a space between adjacent fins FA is filled with an element isolation region (element isolation film, element isolation insulating film) EI, and the periphery of the fin FA is surrounded by the element isolation region EI. The semiconductor substrate SB is made of, for example, p-type monocrystalline silicon having a resistivity of about 1 Ωcm to 10 Ωcm.

The lower end portions of the fins FA are surrounded by element isolation regions EI covering the upper surface of the semiconductor substrate SB in plan view. However, a part including the upper end of the fin FA protrudes above the element isolation region EI. That is, not all the region between adjacent fins is completely filled with the element isolation region EI. The heights of the fins FA protruded above the upper surface of the element isolation regions EI are, for example, about 50 nm.

A plurality of control gate electrodes CG1 and a plurality of memory gate electrodes MG1 extending in the Y direction are arranged on the plurality of fins FA. A drain region DR on the control gate electrode CG1 side and a source region SR on the memory gate electrode side are formed inside the fin FA including the upper surface and the side surface of the fin FA so as to sandwich the control gate electrode CG1 and the memory gate electrode MG1. That is, in the X direction, one control gate electrode CG1 and one memory gate electrode MG1 adjacent to each other are located between the source region SR and the drain region DR.

The drain region DR and the source region SR are n-type semiconductor regions. Hereinafter, the source region SR and the drain region DR constituting one memory cell MC1 may be referred to as a source/drain regions. The drain region DR is formed between two adjacent control gate electrodes CG1 in the X direction, and the source region SR is formed between two adjacent memory gate electrodes MG1 in the X direction. The memory cell MC1 has a control gate electrode CG1, a memory gate electrode MG1, a drain region DR, and a source region SR, and is a nonvolatile memory element that stores data by transferring charges into and out of an Oxide Nitride Oxide (ONO) film. That is, the memory cell MC1 is a cell of the Metal Oxide Nitride Oxide Semiconductor (MONOS) memory of the split-gate type.

The control gate electrode CG1, the source region SR, and the drain region DR constitute a control transistor, the memory gate electrode MG1, the source region SR, and the drain region DR constitute a memory transistor, and the memory cell MC1 is formed of a control transistor and a memory transistor. In the MONOS memory of the split-gate type, in order to realize the shrink of the element, the reduction of the parasitic resistance, and the improvement of the charge-injection efficiency by the source-side injection mechanism, diffusion region (diffusion layer electrode) is not provided between the control transistor and the memory transistor, and the control transistor and the memory transistor are connected to each other by direct channels. That is, neither the source region nor the drain region is formed between the memory gate electrode MG1 and the control gate electrode CG1, and the control transistor and the memory transistor share each of the pair of source/drain regions.

Two memory cells MC1 adjacent to each other in the X direction share a drain region DR or a source region SR. The two memory cells MC1 sharing the drain region DR are line-symmetric in the X direction about an axis extending in the Y direction and passing through the drain region DR. The two memory cells MC1 sharing the source region SR are line-symmetric in the X direction about an axis extending in the Y direction and passing through the source region SR.

A plurality of memory cells MC1 arranged in the X direction are formed on each of the fins FA. Each of the source regions SR of the plurality of memory cells MC1 arranged on one fin is electrically connected to a source line SL formed of a wiring MW via a plug (contact plug, conductive connecting portion) PG formed in a contact hole penetrating an interlayer insulating film (not shown) formed on the memory cell MC1. The drain region DR of each of the plurality of memory cells MC1 arranged in the Y direction is electrically connected to the bit line BL formed of the wiring MW via the plug PG. The source line SL extends in the Y direction, and the bit line BL extends in the X direction.

The fin FA is, for example, rectangular parallelepiped protruding portion protruded from the upper surface of the semiconductor substrate SB in a vertical direction to the upper surface. The fin FA need not necessarily be rectangular parallelepiped, and the corners of the fin FA, which are both ends of the upper surface, may be rounded in cross-sectional view along the short side. Also, each of the side surfaces of the fin FA may be perpendicular to the upper surface of the semiconductor substrate SB, but they may have tilt angles close to perpendicular. That is, each cross-sectional shape of the fin FA is a rectangular parallelepiped or a trapezoid having a width larger at the lower end than at the upper end. FIGS. 2 and 3 show structures in which each of the side surfaces of the fin FA is perpendicular to the upper surface of the semiconductor substrate SB.

As shown in FIG. 1, a direction (X direction) in which the fin FA extends in plan view is a long side direction (longitudinal direction) of each fin, and a direction (Y direction) orthogonal to the long side direction is a short side direction (short side direction) of each fin. That is, the length of the fin is greater than the width of the fin. The fin FA may have any shape as long as it is a protruding portion having a length, a width, and a height. For example, it may have a serpentine layout in plan view.

FIG. 2 shows two memory cells MC1 formed side by side on top of one fin FA. The control gate electrode CG1, the memory gate electrode MG1, the ONO film C1, and the sidewall spacers SW of the memory cell MC1 on the left side of FIG. 2 are shown in cross-section directly above the element isolation region EI. On the other hand, in order to make the drawing easier to understand, the control gate electrode CG1, the memory gate electrode MG1, the ONO film C1, and the sidewall spacers SW of the memory cell MC1 on the right side of FIG. 2 are shown in a cross-section directly above the fin FA. FIG. 2 also omits the showing of an insulating film IF1 and IF2 (see FIG. 3) stacked on the fin FA below the control gate electrode CG1. In FIG. 2, the ONO film C1 is shown as one insulating film without distinguishing between the insulating films constituting the ONO film C1 having the stacked structure.

As shown in FIG. 2, memory cells MC1 are formed on the fin FA constituting the semiconductor substrate SB of the memory cell region. The control gate electrode CG1 and the memory gate electrode MG1 extend in the Y direction so as to straddle the fin FA.

As shown in FIGS. 2 and 3, a protruding portion which is a part of the semiconductor substrate SB is formed on the upper portion of the semiconductor substrate SB. A part of the side surface of the fin FA which is the protruding portion, is surrounded by element isolation region EI formed on the upper surface of the semiconductor substrate SB. The element isolation region EI is filled between adjacent fins FA. However, the element isolation region EI fills only a part of the region between the adjacent fins FA, and the upper end of each fin FA protrudes above the element isolation region EI. That is, the fins are separated from each other by element isolation regions EI. As shown in FIG. 3, a p-type well PW, which is a p-type semiconductor region, is formed in the fin FA from the upper surface of the fin FA to the semiconductor substrate SB below the fin FA. The p-type well PW is a region in which p-type impurities (for example, B (boron)) is introduced into the semiconductor substrate SB.

A control gate electrode CG1 is formed on the upper surface of the fin FA, on the side surface of the fin FA, and on the element isolation region EI via the gate dielectric film GF, and a memory gate electrode MG1 is formed via the ONO film C1 in a region adjacent to the control gate electrode CG1 in the long side direction (X direction) of the fin FA. An ONO film C1 is interposed between the control gate electrode CG1 and the memory gate electrode MG1, and the control gate electrode CG1 and the memory gate electrode MG1 are electrically insulated from each other by the ONO film C1. The ONO film C1 is also interposed between the memory gate electrode MG1 and the upper surface of the fin FA. The ONO film C1 is continuously formed so as to cover the side surface and the bottom surface of the memory gate electrode MG1. Therefore, the ONO film C1 has an L-shaped cross-sectional shape in a cross section along the gate length direction as shown in FIG. 3.

The gate dielectric film GF below the control gate electrode CG1 is formed of a thermal oxide film formed by thermally oxidizing the upper surface and side surfaces of the fin FA, which is the protruding portion of the semiconductor substrate SB made of silicon. The gate dielectric film GF is formed along the surface of the fin FA. That is, the gate dielectric film GF covers the upper surface and side surfaces of the fin FA.

The ONO film C1 is formed of a silicon oxide film X1 made of a thermal oxide film (silicon oxide film) having a thickness of 4 nm formed by thermally oxidizing the upper surface and side surfaces of the fin FA, which is protruding portion of the semiconductor substrate SB made of silicon, a silicon nitride film NF formed on the silicon oxide film X1, and a silicon oxide film X2 formed on the silicon nitride film NF. The silicon nitride film NF is a charge storage portion (charge storage film, charge storage layer) of the memory cell MC1. The silicon nitride film NF has a film thickness of, for example, 7 nm, and the silicon oxide film X2 has a film thickness of, for example, 9 nm.

That is, the ONO film C1 has a stacked-layer structure formed of a silicon oxide film X1, a silicon nitride film NF, and a silicon oxide film X2 which are stacked in this order from the upper surface side of the fin FA, the side surface side of the fin FA, and the side surface side of the control gate electrode CG1. The ONO film C1 covers the upper surface and side surfaces of the fin FA. The thickness of the ONO film C1 is, for example, 20 nm, which is larger than the thickness of the gate dielectric film GF below the control gate electrode CG1. The silicon oxide film X2 may be formed of a silicon oxynitride film.

The control gate electrode CG1 extends in the short side direction (Y direction) of the fin FA, and the control gate electrode CG1 is formed adjacently to the upper surface of the fin FA, the side surface of the fin FA, and the upper surface of the element isolation region EI via the gate dielectric film GF. Similarly, the memory gate electrode MG1 extends along the short side direction of the fin FA, and the memory gate electrode MG1 is formed adjacently to the upper surface and the side surfaces of the fins FA, and the upper surface of the element isolation region EI via the ONO film C1. That is, the gate dielectric film GF and the control gate electrode CG1 completely fill a trench between the fins FA adjacent to each other in the short-side direction of the fin FA. Further, the ONO film C1 and the memory gate electrode MG1 completely fill the trench between the fins FA adjacent to each other in the short-side direction of the fin FA.

The side surfaces of the pattern including the control gate electrode CG1, the memory gate electrode MG1, and the ONO film C1 are covered with the sidewall spacers SW. The sidewall spacer SW has, for example, a stacked structure of a silicon oxide film and a silicon nitride film. However, in FIG. 3, the sidewall spacer SW is shown as one film, and the silicon oxide film and the silicon nitride film are not shown separately.

As shown in FIG. 3, a pair of source/drain regions are formed in the fin FA so as to sandwich the fin FA directly below the pattern including the control gate electrode CG1 and the memory gate electrode MG1. Each of the source region SR and the drain region DR is constituted by a diffusion region which is an $n^+$ type semiconductor region formed in the fin FA. These diffusion regions are semiconductor regions in which n-type impurities (for example, P (phosphorus) or arsenic (As)) are introduced into the fin FA.

Although the source region SR and the drain region DR are each constituted by a high-concentration diffusion region (diffusion layer), each of the source region SR and the drain region DR may have an extension region (LDD region) which is an $n^-$ semiconductor region formed in the fin FA, in addition to the diffusion region. The Lightly Doped Drain (LDD) region, that is, the extension region, is a region having an impurity concentration lower than that of the diffusion region, and is a region formed on the upper surface and the side surfaces of the fin FA. The extension regions are formed on the surface of the fin directly below the control gate electrode CG1 and the memory gate electrode MG1, that is, on the channel region side, with respect to the diffusion regions. The diffusion region constituting the source region SR and the extension region are formed in contact with each other, and the diffusion region constituting the drain region DR and the extension region are formed in contact with each other. Note that the source region SR may be constituted by only a diffusion region, and the drain region DR may be constituted by a diffusion region and an extension region.

The drain region DR is adjacent to the fin FA directly below the control gate electrode CG1, and the source region SR is adjacent to the fin FA directly below the memory gate electrode MG1. That is, of the source/drain regions sandwiching the pattern including the control gate electrode CG1 and the memory gate electrode MG1 in plan view, the drain region DR is located on the control gate electrode CG1 side, and the source region SR is located on the memory gate electrode MG1 side. In other words, in plan view, the drain region DR is adjacent to the control gate electrode CG1, and the source region SR is adjacent to the memory gate electrode MG1.

Silicide layers (not shown) are formed on the surfaces of the source region SR and the drain region DR exposed from the pattern including the control gate electrode CG1, the memory gate electrode MG1, and the sidewall spacers SW. Silicide layers (not shown) are also formed on the upper surface of each of the control gate electrode CG1 and the memory gate electrode MG1. The silicide layers are made of, for example, nickel silicide (NiSi).

An interlayer insulating film IL1 formed of, for example, a silicon oxide film is formed on the fin FA and the element isolation region EI via a thin liner insulating film (not shown) formed of, for example, a silicon nitride film. The liner insulating film and the interlayer insulating film IL1 cover the fin FA, the element isolation region EI, and the silicide layers, and the upper surface of the interlayer insulating film IL1 is planarized at substantially the same height as the upper surface of each of the control gate electrode CG1, the memory gate electrode MG1, and the sidewall spacers SW. A liner insulating film is interposed between the side surfaces of the sidewall spacers SW and the interlayer insulating film IL1. An interlayer insulating film IL2 is formed on the interlayer insulating film IL1 to cover the upper surface of each of the control gate electrode CG1, the memory gate electrode MG1, and the sidewall spacers SW. The upper surface of the interlayer insulating film IL2 is planarized. The interlayer insulating film IL2 is formed of, for example, a silicon oxide film.

A plurality of wirings MW (see FIG. 1) are formed on the interlayer insulating film IL2, and the wirings MW are electrically connected to the source region SR or the drain region DR of the memory cell MC1 via plugs PG provided in contact holes penetrating the interlayer insulating films IL1 and IL2. In the power supply region (not shown) of the control gate electrode CG1, a plug is connected to the upper surface of the control gate electrode CG1. In the power supply region (not shown) of the memory gate electrode MG1, a plug PG is connected to the upper surface of the memory gate electrode MG1.

The memory cell MC1 has a control gate electrode CG1, a memory gate electrode MG1, a drain region DR, and a source region SR. The control gate electrode CG1, the source region SR, and the drain region DR constitute a control transistor, the memory gate electrode MG1, the source region SR, and the drain region DR constitute a memory transistor, and the memory cell MC1 is constituted by a control transistor and a memory transistor. That is, the control transistor and the memory transistor share a source/drain region. The distance between the source region SR and the drain region DR in the gate length direction (X direction) of the control gate electrode CG1 and the memory gate electrode MG1 corresponds to the channel length of the memory cell MC1. Each of the control transistor and the memory transistor is a Fin Field Effect Transistor (FINFET) having the surface (upper surface and side surface) of the fin FA as channels, that is, a fin-type field effect transistor.

The main features of the semiconductor device of present embodiment will be described. The main characteristic of the memory cell MC1, which is the semiconductor device of present embodiment, is that the diffusion region constituting the source region SR is spaced downward from the upper surface of the fin FA in the region directly below the memory gate electrode MG1. That is, here, the upper surface of the fin FA exposed from the control gate electrode CG1, the memory gate electrode MG1, and the ONO film C1, that is, the upper surface of the fin FA sandwiching the control gate electrode CG1, the memory gate electrode MG1, and the ONO film C1 in the gate length direction (X direction) is located lower than the upper surface of the fin FA directly below the memory gate electrode MG1.

Hereinafter, the upper surface of the fin FA in the region directly below the memory gate electrode MG1 is referred to as a first upper surface, and the upper surface of the fin FA which is the upper surface of the fin FA exposed from the control gate electrode CG1, the memory gate electrode MG1, and the ONO film C1 and which is located adjacent to the memory gate electrode MG1 in plan view in the gate length direction is referred to as a second upper surface. That is, the fin FA has a first upper surface, which is the uppermost surface of the fin FA, and a second upper surface lower than the first upper surface. The upper surface of the fin FA in the region directly below the control gate electrode CG1 is located at the same height as the first upper surface. A step exists between the first upper surface and the second upper surface, and the first upper surface and the second upper surface are spaced apart from each other. That is, the upper ends of the fins FAs including the first upper surface project upward with respect to the second upper surface.

Here, the source region SR of the memory cell MC1 is formed from the second upper surface to the inside of the fin FA, but the source region SR is not formed in the first upper surface. In this manner, the source region SR is spaced downward from the first upper surface. That is, the source region SR is not formed on the uppermost surface of the fin FA, but is formed on the second upper surface of the upper surface of the fin FA that is retracted below the first upper surface. That is, the end portion of the source region SR on the drain region DR side is located below the first upper surface. In other words, the source region SR is spaced downward from the bottom surface of the ONO film C1 directly below the memory gate electrode MG1. As described above, the source region SR is not in contact with the ONO film C1 in the upper surface of the fin FA.

The width of the fin FA in the short side direction (Y direction) is, for example, about 30 nm at the lower end of the fin FA, and is, for example, about 10 nm at the upper end of the fin FA. On the other hand, the distance in the height direction between the first upper surface and the second upper surface, that is, the recess amount of the second upper surface, is, for example, 5 nm to 10 nm.

Although the source region SR is not formed directly below the memory gate electrode MG1 in FIG. 3, a part of the source region SR may be formed in the fin FA at a position deeper than the first upper surface directly under the memory gate electrode MG1. The source regions SR formed on the side surfaces of the fin FA may be in contact with the ONO film C1 directly below the memory gate electrode MG1. However, even in this instance, the source region SR directly below the memory gate electrode MG1 is spaced apart from the source region SR in the first upper surface. The structure in which the source region SR is formed directly under the memory gate electrode MG1 will be described later with reference to FIGS. 24 and 25 in the modification of second embodiment.

Here, the upper surface of the diffusion region constituting the drain region DR is also formed to be spaced apart from the uppermost surface of the fin FA. In other words, the drain region DR is formed in the third upper surface of the fin FA that retracts downward from the uppermost surface of the fin FA including the first upper surface. The third upper surface is an upper surface of fin FA located at a similar height as the second upper surface. A part of the drain region DR may be formed on the uppermost upper surface of the fin FA, that is, on the upper surface of the fin FA directly below the control gate electrode CG1. The bottom surface of the sidewall spacer SW covering the side surface of the memory gate electrode MG1 is not in contact with the first upper surface, but in contact with the second upper surface.

Insulating films IF1 and IF2 stacked in order on the upper surface of the fin FA are formed between the upper surface of the fin FA and the gate dielectric film GF. The insulating film IF1 is formed of, for example, a silicon oxide film, and the insulating film IF2 is formed of, for example, a silicon nitride film. The insulating films IF1 and IF2 are not necessarily formed.

Operation of Nonvolatile Memory

Next, an operation example of a nonvolatile memory will be described with reference to FIG. 4.

FIG. 4 is a table showing an example of the application condition of a voltage (unit: V) to each portion of the selected memory cell at the time of "write", "erase" and "read". In the table of FIG. 4, voltages Vbl, Vwl, Vmg, Vsl, and Vb to be applied to the memory cell (selected memory cell) MC1 shown in FIG. 3 at the time of "write", "erase", and "read" respectively are described. The voltage Vbl is a voltage to be applied to the drain region DR, the voltage Vwl is a voltage to be applied to the control gate electrode CG1, the voltage Vmg is a voltage to be applied to the memory gate electrode MG1, the voltage Vsl is a voltage to be applied to the source region SR, and the voltage Vb is a voltage to be applied to the p-type well PW.

The tables of FIG. 4 show specific examples of voltages in a device assuming that the biasing state of the terminals during the operations of "write", "erase" and "read" are 1.5V voltages. Note that what is shown in the table of FIG. 4 is a preferable example of the voltage application condition, and is not limited to this, and various changes can be made as necessary. Further, in the present embodiment, injection of electrons into the silicon nitride film NF, which is the charge storage portion in the ONO film C1 of the memory transistor, is defined as "write" and injection of holes is defined as "erase".

A write method (hot electron injection write method) referred to as a so-called Source Side Injection (SSI) method in which write is performed by hot electron injection by source side injection, can be used. For example, by applying voltages as shown in the "write" column of FIG. 4 to each portions of the selected memory cell to be written, the channels of the control transistor and the memory transistor are turned on. As a result, hot carrier electrons generated in the channel are injected into the silicon nitride film NF in the ONO film C1 of the selected memory cell to perform write. At this time, a particularly high voltage Vmg is applied to the memory gate electrode MG1. Note that Vbl is denoted as "0/1.5" in the column of "write" in FIG. 4, which means that a 0V is applied to the drain region DR when write is performed by flowing a current through the channel of the memory cell MC1, and 1.5V is applied to the drain region DR when write is performed without flowing a current through the channel.

At this time, hot electrons are generated in the channel region below a region between the two gate electrodes (the memory gate electrode MG1 and the control gate electrode CG1) and hot electrons are injected into the silicon nitride film NF, which is the charge storage portion in the ONO film C1 below the memory gate electrode MG1. The injected hot electrons are trapped by the trap levels of the silicon nitride film NF in the ONO film C1, and as a result, the threshold voltage of the memory transistor rises. That is, the memory transistor is in the write state.

An erase method (hot hole injection erase method) referred to as a so-called BTBT method in which erase is performed by hot hole injection by Band-To-Band Tunneling (BTBT), can be used. That is, holes generated by BTBT are injected into the charge storage portion (the silicon nitride film NF in the ONO film C1) to perform erase. For example, voltages as shown in the column "erase" of FIG. 4 is applied to the each portions of the selected memory cell to be erased, holes are generated by BTBT phenomena in the electric field between the source region SR and the memory gate electrode MG1, and holes are injected into the silicon nitride film NF in the ONO film C1 of the selected memory cell by accelerating the electric field, thereby lowering the threshold voltage of the memory transistor. That is, the memory transistor is in the erase state. In the erase operation, a negative voltage Vmg is applied to the memory gate electrode MG1 in order to generate holes by BTBT phenomena.

At the time of read, for example, voltages as shown in the column of "read" in FIG. 4 are applied to each portions of the selected memory cell to be read, thereby turning on the control gate electrode CG1. By setting the voltage Vmg applied to the memory gate electrode MG1 at the time of read to a value between the threshold voltage of the memory transistor in the write state and the threshold voltage of the memory transistor in the erase state, it is possible to discriminate between the write state and the erase state. That is, by turning on the control gate electrode CG1 and reading out the charge trapping state of the memory gate electrode MG1 as the magnitude of the current value, the storage state of the data can be known.

Effect of Semiconductor Device of Present Embodiment

Figure 5:
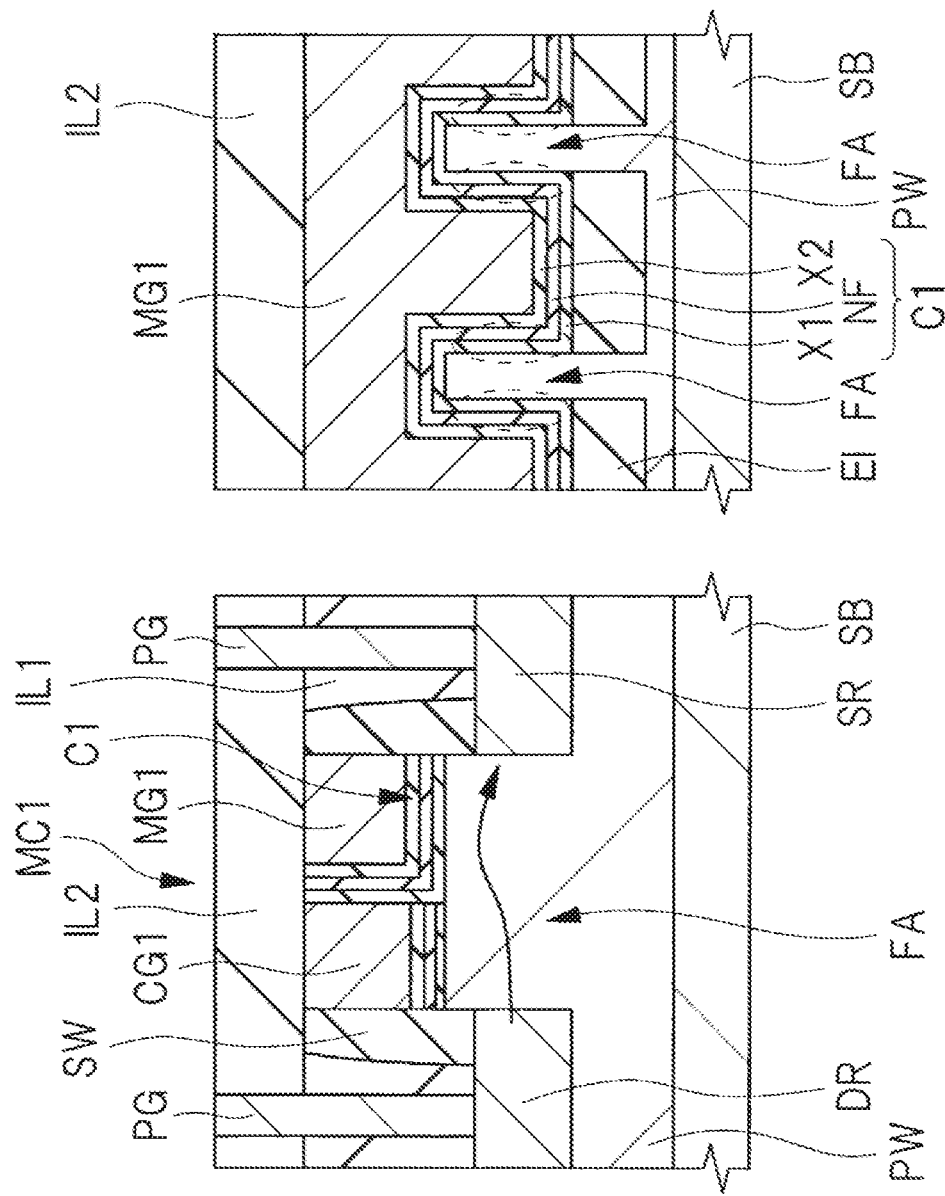
FIG. 5 is a cross-sectional view for explaining a write operation of the semiconductor device according to the first embodiment.
Figure 6:
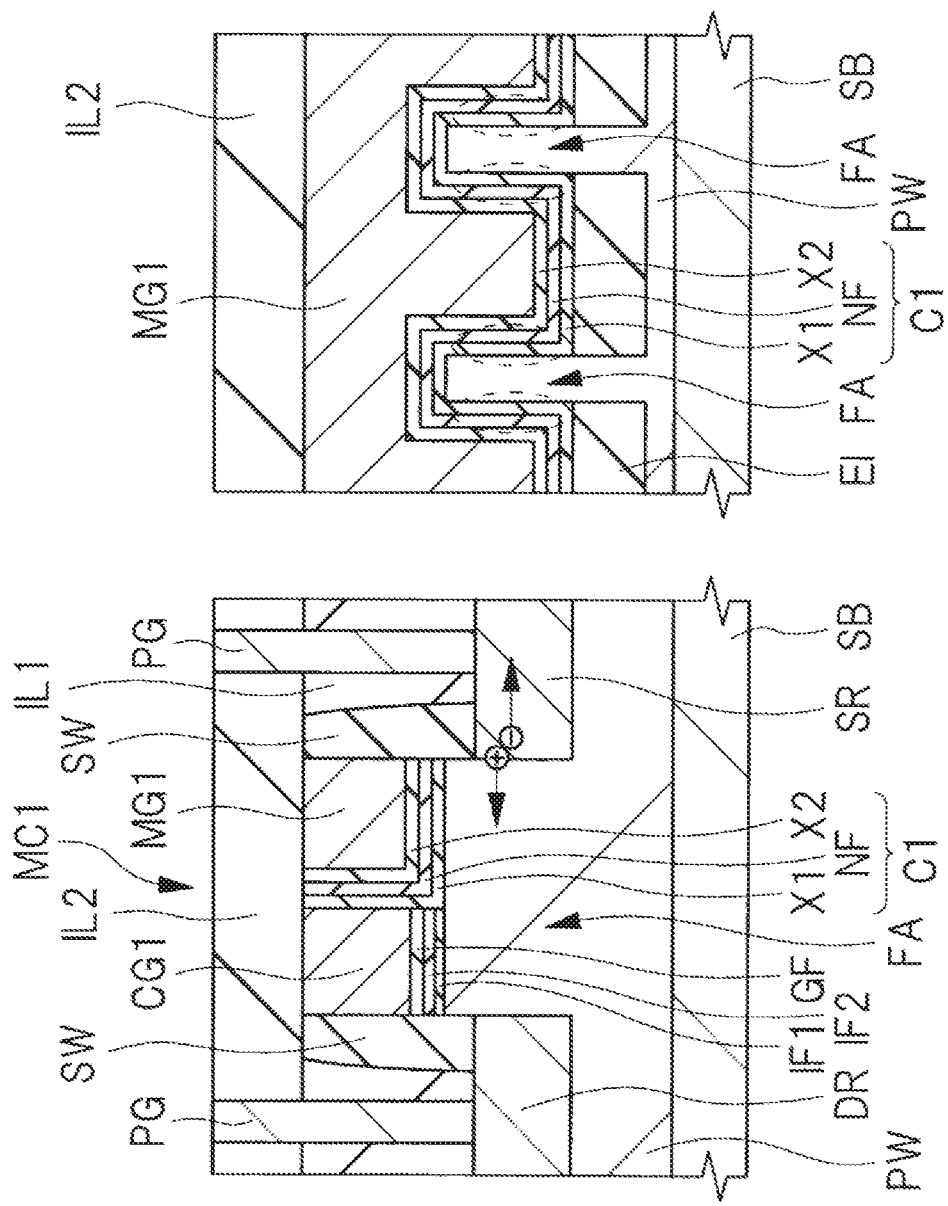
FIG. 6 is a cross-sectional view for explaining an erase operation of the semiconductor device according to the first embodiment.
Figure 34:
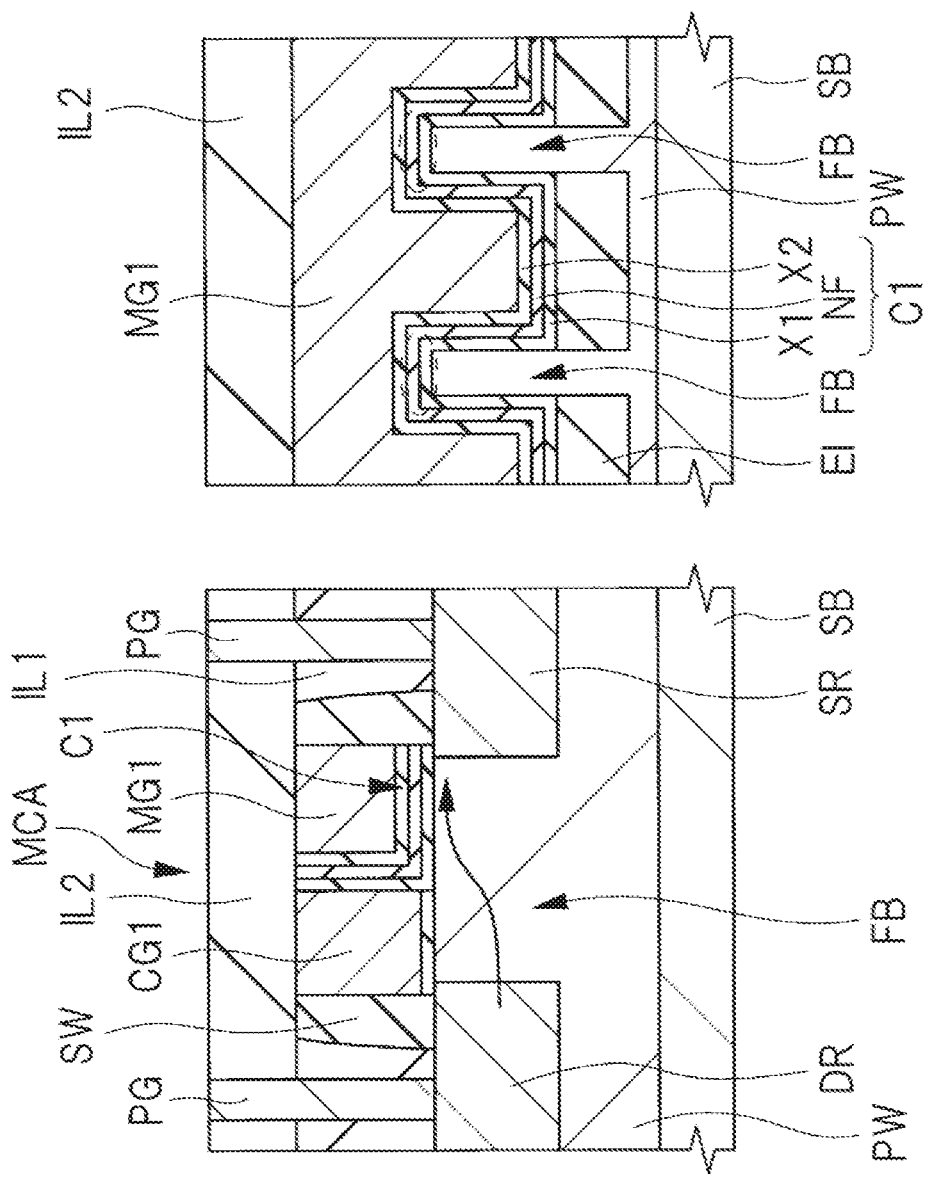
FIG. 34 is a cross-sectional view for explaining a write operation of a semiconductor device according to a compared example.
Figure 35:
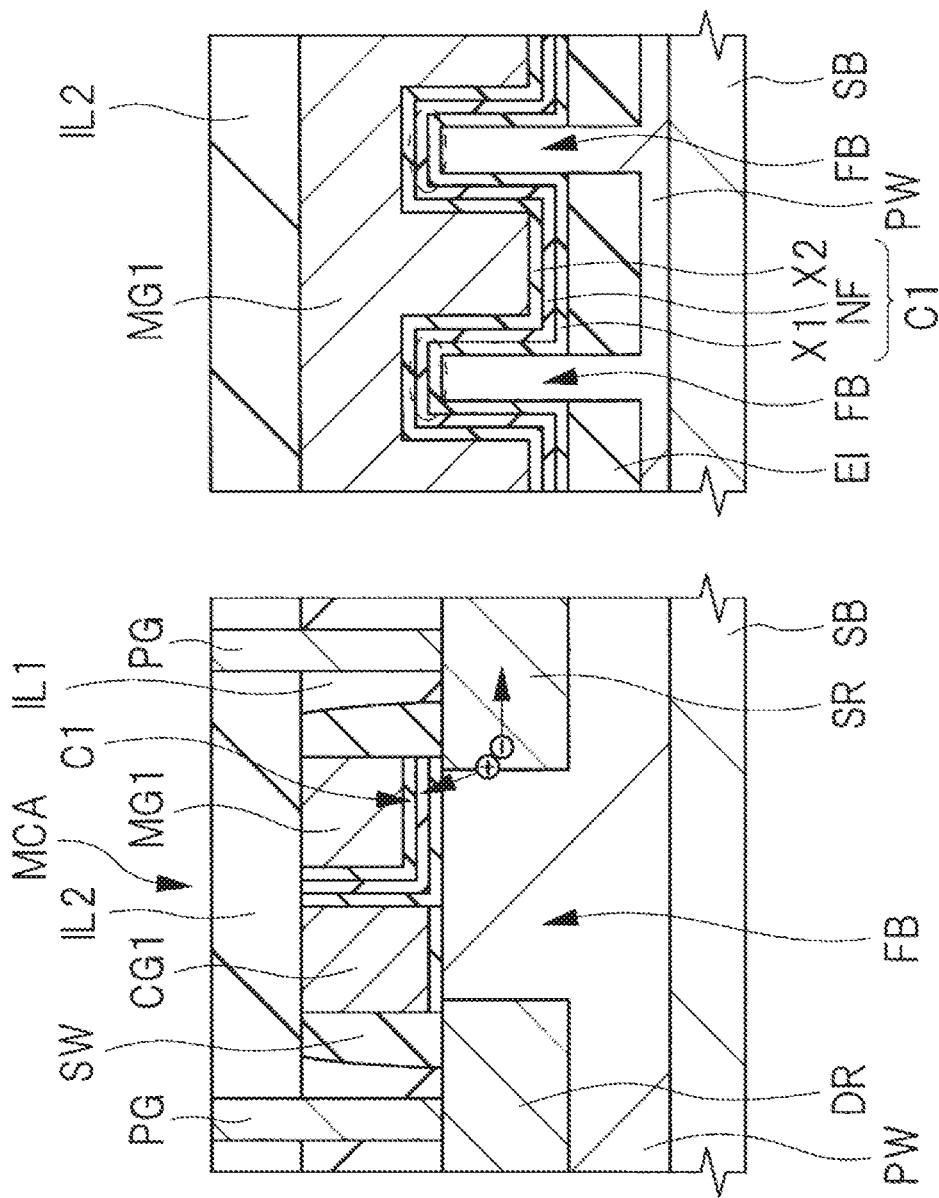
FIG. 35 is a cross-sectional view for explaining an erase operation of the semiconductor device according to the compared example.

Hereinafter, the effect of the semiconductor device of present embodiment will be described with reference to FIGS. 5, 6, 34 and 35. FIG. 5 is a cross-sectional view for explaining a write operation in the memory cell according to the present embodiment. FIG. 6 is a cross-sectional view for explaining an erase operation in the memory cell according to the present embodiment. FIG. 34 is a cross-sectional view for explaining a write operation in the memory cell according to a compared example. FIG. 35 is a cross-sectional view for explaining an erase operation in the memory cell according to the compared example.

FINFET is an element which can be expected to have effects such as improvement of short channel characteristics, improvement of current driving power, improvement of switching characteristics, and reduction of variation in threshold voltages of transistors, as compared with a planar transistor having a channel region only in the upper surface of semiconductor substrate. On the other hand, in the FINFET, the fin shape reduces the vertical-direction electric field of the channel, but has the characteristics that the electric field concentration tends to occur at the top of the fin.

As shown in FIG. 4, although the polarity is reversed at the time of write and erase, a large voltage Vmg is applied to the memory gate electrode of the MONOS memory of the split-gate type. Therefore, a situation at the time of write and erase of the memory cell MCA of the compared example will be described below. The structure of the memory cell MCA of the compared example shown in FIGS. 34 and 35 is different from the structure of the memory cell MC1 described with reference to FIG. 3 in that the height of the upper surface of the fin FB is the same in any of the region directly below the memory gate electrode MG1, the formation region of the source region SR, and the formation region of the drain region DR, and there is no step in the upper surface of the fin FB.

However, although it is conceivable that the upper surface of the fin FB exposed from the ONO film C1 retracts when the ONO film C1 is processed, and a step is formed on the upper surface of the fin FB, the memory cell MCA of the compared example differs from the memory cell MC1 described with reference to FIG. 3 in that a part of the source region SR is formed on the upper surface of the fin FB directly below the memory gate electrode MG1. In FIGS. 34 and 35, the insulating films IF1 and IF2 (see FIG. 3) are not shown.

FIG. 34 shows the electric field and the current path (carrier behavior) during the write operation of the compared example. In FIG. 34, the flow of current is indicated by an arrow in the cross-sectional view on the left side, and in the cross-sectional view on the right side, a portion where an electric field is easily concentrated and carriers are easily injected into the ONO film C1 is surrounded by broken lines. Since a large voltage is applied to the memory gate electrode MG1, the current flowing mainly on the side surfaces of the fin FB on the control gate electrode CG1 side concentrates on the top of the fin FB below the memory gate electrode MG1. Therefore, charge injection into the ONO film C1 is locally performed at the top of the fin FB.

FIG. 35 shows the electric field and the current path (carrier behavior) at the time of the erase operation of the compared example. In FIG. 35, the flow of carriers is indicated by an arrow in the cross-sectional view on the left side, and in the cross-sectional view on the right side, a portion where an electric field is easily concentrated and carriers are easily injected into the ONO film C1 is surrounded by broken lines. Here, since the electric field concentrates at the top of the fin FB at the end portion of the source region SR on the channel region side, the generated holes are also locally injected into the charge storage film in the vicinity of the fin FB.

In this manner, at the top of the fin, the upper surface and both side surfaces are surrounded by the gate electrode, and the top of the fin is a portion where the electric field is easily concentrated. In particular, since a higher voltage is applied to the memory gate electrode at the time of write and erase of the MONOS memory of the split-gate type, charges are locally injected into the ONO film. When these local injections occur at the time of write and erase, in a cell in which rewriting is performed using electron-hole injection, charges of opposite polarity, which are referred to as erase residual, continue to locally remain in the ONO film, and thereby effective rewriting cannot be performed. As a result, the rewrite durability deteriorates. That is, since the time required for the write operation and the erase operation becomes longer and longer, the number of times of rewriting of the element is reduced. That is, the lifetime of the semiconductor device is reduced. In addition, when a large amount of charges is locally injected and held, the movement of the charge due to the self-electric field becomes obvious, and therefore, there is a problem that retention characteristics (charge retention characteristics) deteriorate.

On the other hand, in the semiconductor device of the present embodiment, as shown in FIG. 3, the upper surface (second upper surface) of the fin FA, which is the upper surface of the fin FA exposed from the control gate electrode CG1, the memory gate electrode MG1, and the ONO film C1 and in which the source region SR is formed, is made to retract below the upper surface (first upper surface) of the fin FA directly below the memory gate electrode MG1. That is, the position where the source region SR is formed in the upper surface of the fin FA is offset downward from the first upper surface of the fin FA contacting the ONO film C1 directly below the memory gate electrode MG1. Therefore, the formation position of the uppermost surface of the source region SR is spaced downward from the first upper surface. The flow of current (carrier behavior) in the write operation and the erase operation in this case will be described below.

FIG. 5 shows the electric field and current paths (carrier behavior) during the write operation of the present embodiment. In FIG. 5, the flow of current is indicated by an arrow in the cross-sectional view on the left side, and in the cross-sectional view on the right side, a portion where an electric field is easily concentrated and carriers are easily injected into the ONO film C1 is surrounded by broken lines. In the write operation, since the source region SR is present only at a position lower than the first upper surface, the current flowing from the control gate electrode CG1 side flows inside the fin FA (substrate) by being pulled by the source potential.

That is, since there is a distance between the first upper surface of the fin FA directly below the control gate electrode CG1 and the upper surface (second upper surface) of the source region SR in the vertical direction, carriers are difficult to flow into the fin FA in the vicinity of the first upper surface. Here, the vertical direction refers to a direction perpendicular to the upper surface (main surface) of the semiconductor substrate SB, the first upper surface of the fin FA, and the second upper surface of the fin FA, respectively. However, the side surfaces of the fin FA covered with the memory gate electrode MG1 and the side surfaces of the source region SR exist in the same plane. That is, in the channel on the side surface of the fin FA, there are no offsets between the side surface of the fin FA covered by the memory gate electrode MG1 and the side surface of the source region SR in direction perpendicular to the side surface of the fin FA. Therefore, the current flows mainly through the channel generated on the side surface of the fin FA, and is injected into the ONO film C1 covering the side surface of the fin FA. Therefore, it is possible to prevent the charge injection from concentrating on the ONO film C1 at the top of the fin FA.

In the FINFET, even if a step is provided on the upper surface of the fin FA as described above, the current flows in the side surface of the fin FA, and therefore, the resistance between the source and the drain does not become an issue. That is, at the time of read, as shown in FIG. 4, a ground potential (0 V) is applied to the source region, and a power supply voltage is applied to the drain region. In this instance, the height of the fin FA below the second upper surface is 40 to 45 nm with respect to the height 50 nm of the fin FA shown in FIG. 3, and the diffusion region of the source region SR is reduced by an amount corresponding to the retraction of the second upper surface with respect to the first upper surface. However, when the channel is formed, the top portion of the fin FA is a region having a high channel conductance because of a high electric field. Therefore, the current from the diffusion region exhibits the behavior of spreading to the top. As described above, even if the top portion including the second upper surface of the fin FA is offset with respect to the first upper surface, since the offset does not exist mainly on the side surface of the fin FA on which the channel is formed, the reduction of the current is only about 10%, and it does not cause any obstacle at the time of read.

Note that in a MONOS memory of a split-gate type constituted by a planar transistor having no fins and channel formed only in a flat upper surface of a semiconductor substrate, it is not practical to space the source region downward from the upper surface of the semiconductor substrate directly below the memory gate electrode, as in the case of the present embodiment. This is because a current hardly flows between the source and the drain due to the offset of the source region. On the other hand, in the memory cell MC1 of the present embodiment including the FINFET, even if the source region SR is offset downward, the current flows through the channel formed on the side surface of the fin FA, so that the current hardly decreases as described above.

Regarding the recess amount of the second upper surface with respect to the first upper surface, it is desirable to design the recess amount so as to satisfy the following equation (1), assuming that the width of the fin at the upper portion of the fin is Wtop, the height of the fin above the element isolation region is Hfin, and the recess amount is dr.

$$W\text{top} < dr < 0.1 \times H\text{fin} \quad \text{(Equation 1)}$$

Electric fields and current paths (carrier behavior) during erase operation of the present embodiment are shown in FIG. 6. In FIG. 6, the flow of carriers is indicated by an arrow in the cross-sectional view on the left side, and in the cross-sectional view on the right side, a portion where an electric field is easily concentrated and carriers are easily injected into the ONO film C1 is surrounded by broken lines. In the erase operation, since the upper surface of the source region SR and the first upper surface are spaced apart from each other in a vertical direction, band-to-band tunneling occurs on the side surfaces of the fin FA at the end portion of the source region SR on the drain region DR side, and holes are generated. The generated holes are horizontally accelerated by the electric field between the source and the channel and injected into the charge storage film while spreading to the region close to the control gate electrode CG1. The holes shown in FIG. 6 are mainly injected into the ONO film C1 surrounded by broken lines in the right-hand cross section of FIG. 6, that is, into the ONO film C1 covering the side surface of the fin FA.

In the FINFET, since the gate electric field is applied from both side surfaces, the electric field distribution in the fin is flatter than in the planar type transistor. Therefore, here, the distribution of the holes in the fin FA spreads, and the holes can reach far while being accelerated. Therefore, it is possible to prevent holes from being concentrated and injected into the ONO film C1 in the vicinity of the top of the fin FA at the end of the source region SR on the drain region DR side.

As described above, since the local injection of charges can be avoided in both the write operation and the erase operation, it is possible to prevent rewrite resistance deterioration caused by local charge injection and deterioration of retention characteristics. Therefore, since the number of rewriting of the nonvolatile memory element can be increased, the performance of the semiconductor device can be improved.

Manufacturing Process of Semiconductor Device

Hereinafter, a method of manufacturing the semiconductor device according to the present embodiment will be described with reference to FIGS. 7 to 21. In FIGS. 7 to 21, similarly to FIG. 4, a cross section along the X direction (see FIG. 1) is shown, and a cross section along the Y direction (see FIG. 1) is shown on the right side of the cross section. A cross section along the Y direction is a cross section including a region where a memory gate electrode is formed. Also, although the side surface of each of the fins is shown vertically in FIGS. 8-21, the side surface of the fin may be tapered relative to the upper surface of the semiconductor substrate. In the present application, the source region and the drain region are sometimes referred to as "formed on the upper surface of the fin", but in this instance, the source region and the drain region are formed not only on the upper surface of the fin but also on the side surfaces of the fin and inside the fin.

In the manufacturing step of the semiconductor device according to the present embodiment, first, as shown in FIG. 7, a semiconductor substrate (semiconductor wafer) SB is prepared. The semiconductor substrate SB is, for example, a p-type substrate made of monocrystalline silicon (Si), and has a main surface (upper surface) which is a first surface on which a semiconductor element such as a transistor is formed, and a back surface (bottom surface) which is a second surface on the other side of the semiconductor substrate. Subsequently, insulating films IF1 and IF2 are sequentially formed on the semiconductor substrate SB by, for example, a Chemical Vapor Deposition (CVD) method. The insulating film IF1 is formed of, for example, a silicon oxide film, and the insulating film IF2 is formed of, for example, a silicon nitride film. The insulating films IF1 and IF2 are films used as hard masks for forming fins.

Figure 8:
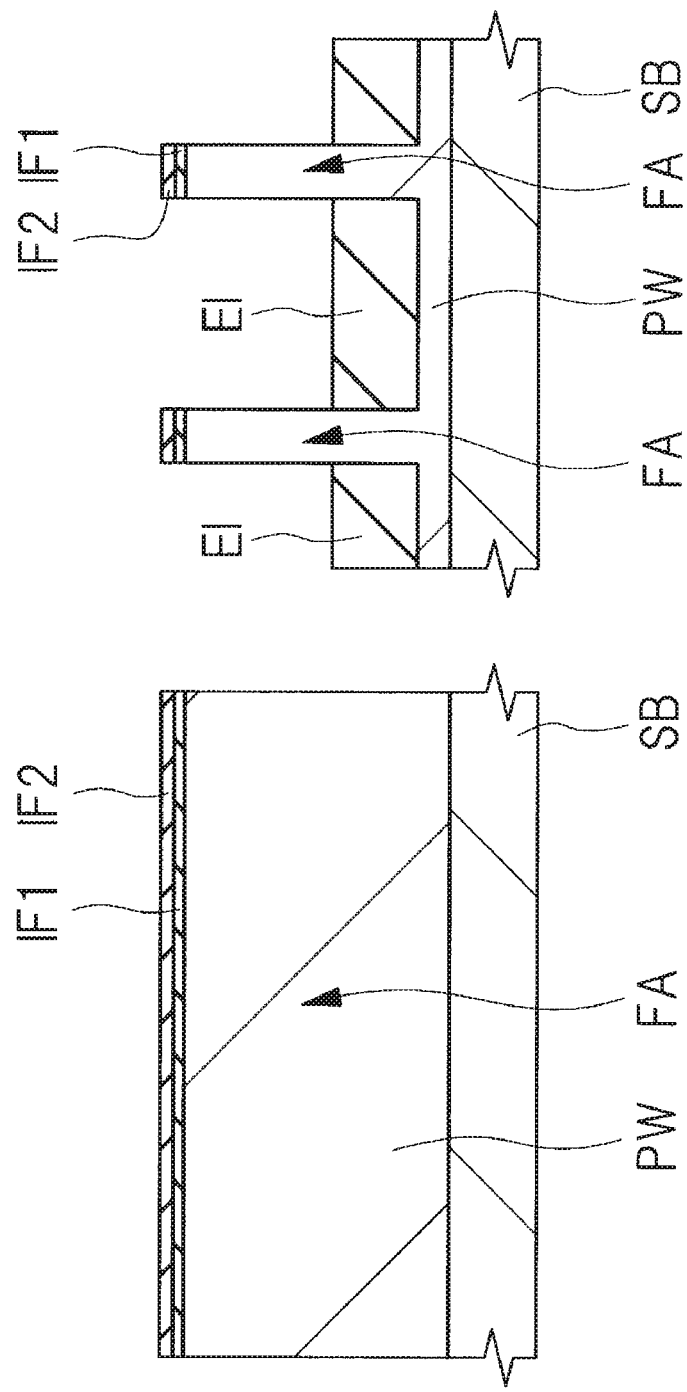
FIG. 8 is a cross-sectional view during the manufacturing step of the semiconductor device following FIG. 7.

Next, as shown in FIG. 8, fins protruded from the upper surface of the semiconductor substrate SB are formed. That is, the stacked film formed of the insulating films IF1 and IF2 is patterned by photolithography and an etch method to expose the upper surface of the semiconductor substrate SB. In this patterning step, for example, the stacked film can be processed using hard masks (not shown) formed in a sidewall spacer shape on the side surfaces of silicon films (not shown) formed on the insulating film IF2.

Subsequently, dry etching is performed using the stacked film as hard masks, whereby a part of the upper surface of the semiconductor substrate SB is retracted. As a result, a plurality of trenches are formed in the upper surface of the semiconductor substrate SB, and fins FA sandwiched between the two trenches are formed. The fins FA are part of the semiconductor substrate SB and are formed below the stacked film. Each of the plurality of fins FA is a protruding portion extending upward from the upper surface of the semiconductor substrate SB. The fins FA extend in the X direction, and fins FA are arranged side by side in the Y direction. That is, the length of the fin FA in the X direction is greater than the length of the fin FA in the Y direction.

Subsequently, an insulating film formed of a silicon oxide film, for example, is filled inside each of the plurality of trenches to form an element isolation region EI formed of the insulating film. Here, for example, after a silicon oxide film is deposited on the semiconductor substrate SB including the inside of each of the plurality of trenches by, for example, a CVD method, an excess silicon oxide film above the upper surface of the fins FA is removed by, for example, a CMP method. Subsequently, dry etch is performed to cause the upper surface of the silicon oxide film to retract downward, thereby forming element isolation region EI formed of the silicon oxide film. By performing the etching back in this manner, a part of the upper side of the fins FA protrudes above the upper surface of the element isolation region EI. The height of the fin FA exposed on the element isolation region EI is, for example, 50 nm. In the process of forming the element isolation region EI, it is also conceivable that the stacked film formed of the insulating films IF1 and IF2 is also removed, but here, the case where the stacked film remains will be described.

Subsequently, p-type impurities (for example, B (boron)) are implanted into the semiconductor substrate SB by an ion implantation method or the like, thereby forming a p-type well PW, which is a p-type semiconductor region, in the semiconductor substrate SB including the fin FA.

Figure 9:
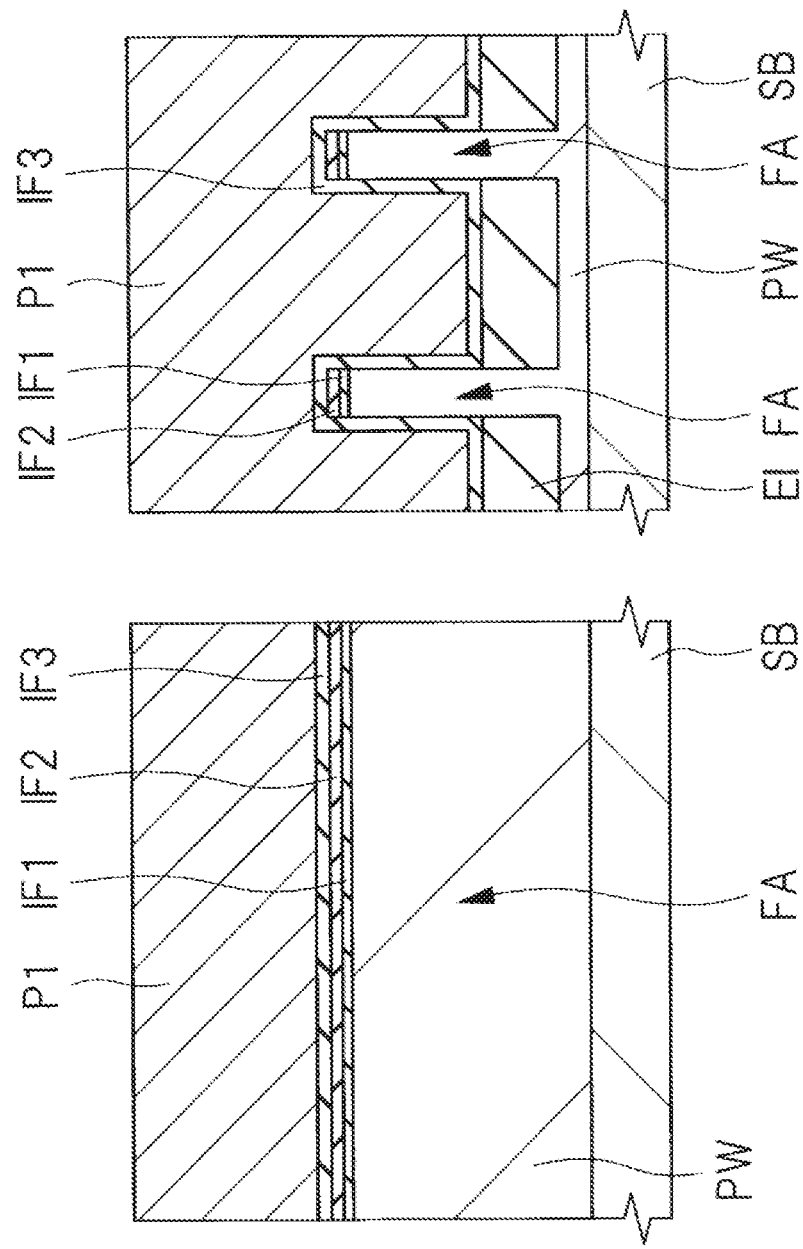
FIG. 9 is a cross-sectional view during the manufacturing step of the semiconductor device following FIG. 8.

Next, as shown in FIG. 9, an insulating film IF3 and a polysilicon film P1 are sequentially formed on the main surface of the semiconductor substrate SB. The insulating film IF3 is formed of, for example, a silicon oxide film, and the insulating film IF3 and the polysilicon film P1 are formed by, for example, a CVD method. N-type impurities (for example, As (arsenic)) are introduced into a part of the polysilicon film P1.

Figure 10:
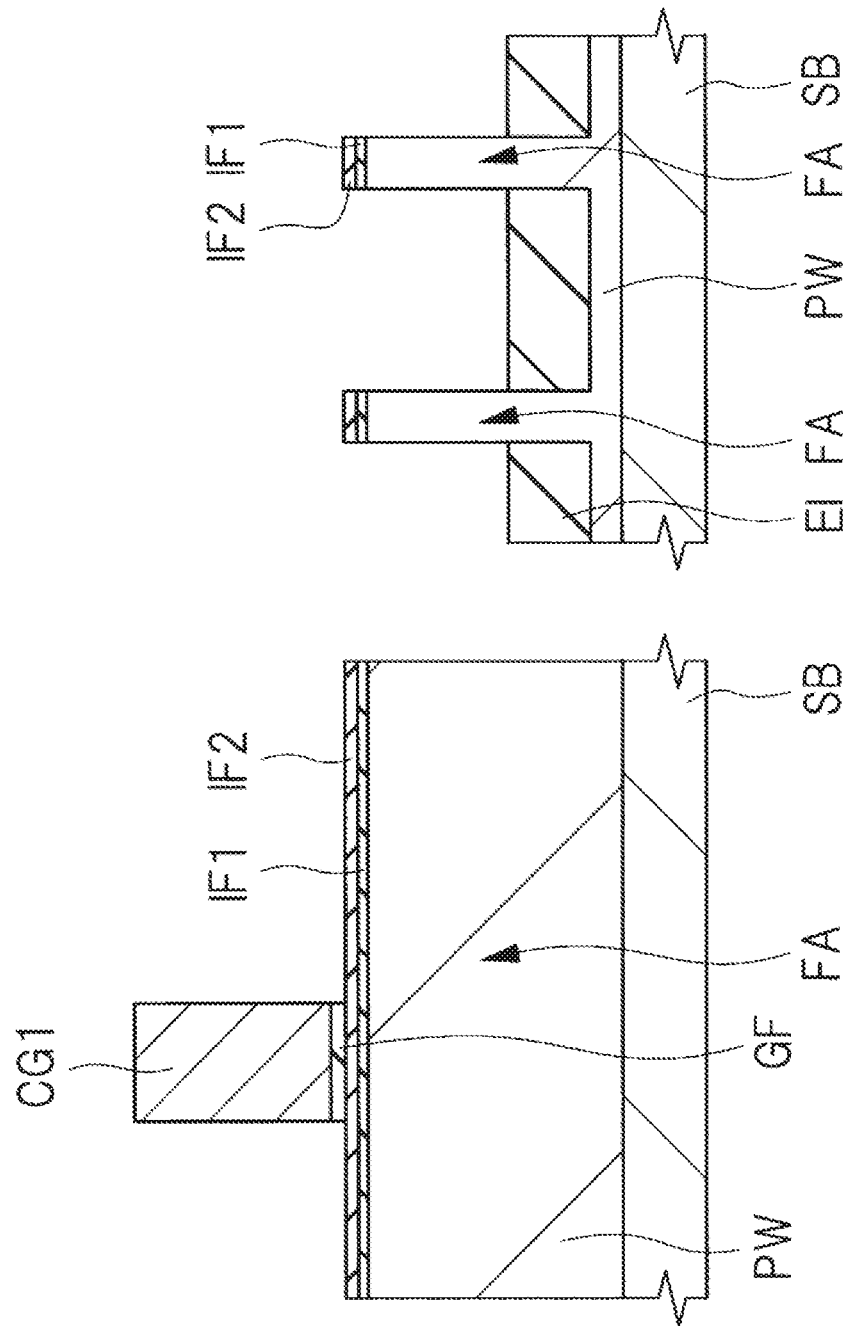
FIG. 10 is a cross-sectional view during the manufacturing step of the semiconductor device following FIG. 9.

Next, as shown in FIG. 10, a pattern of a photoresist film (not shown) is formed on the polysilicon film P1 by photolithography. Thereafter, the polysilicon film P1 and the insulating film IF3 are processed (patterned) by a dry etching method using the photoresist film as a mask (an etching preventing mask), thereby exposing portions of the upper surface and the side surfaces of the fins FA from the polysilicon film P1 and the insulating film IF3.

A control gate electrode CG1 formed of the polysilicon film P1 and a gate dielectric film GF formed of the insulating film IF3 are formed by the etching process. The pattern of the stacked film formed of the gate dielectric film GF and the control gate electrode CG1 extend in the Y direction (in the depth direction in FIG. 10). That is, the pattern covers the upper surface and the side surfaces of the fins FA, and is formed so as to straddle each of the plurality of fins FA arranged in the Y direction. Although only one control gate electrode CG1 is shown in FIG. 10, a plurality of the control gate electrode patterns are formed on the fins FA side by side in the X direction (in the extending direction of the fin FA).

Figure 11:
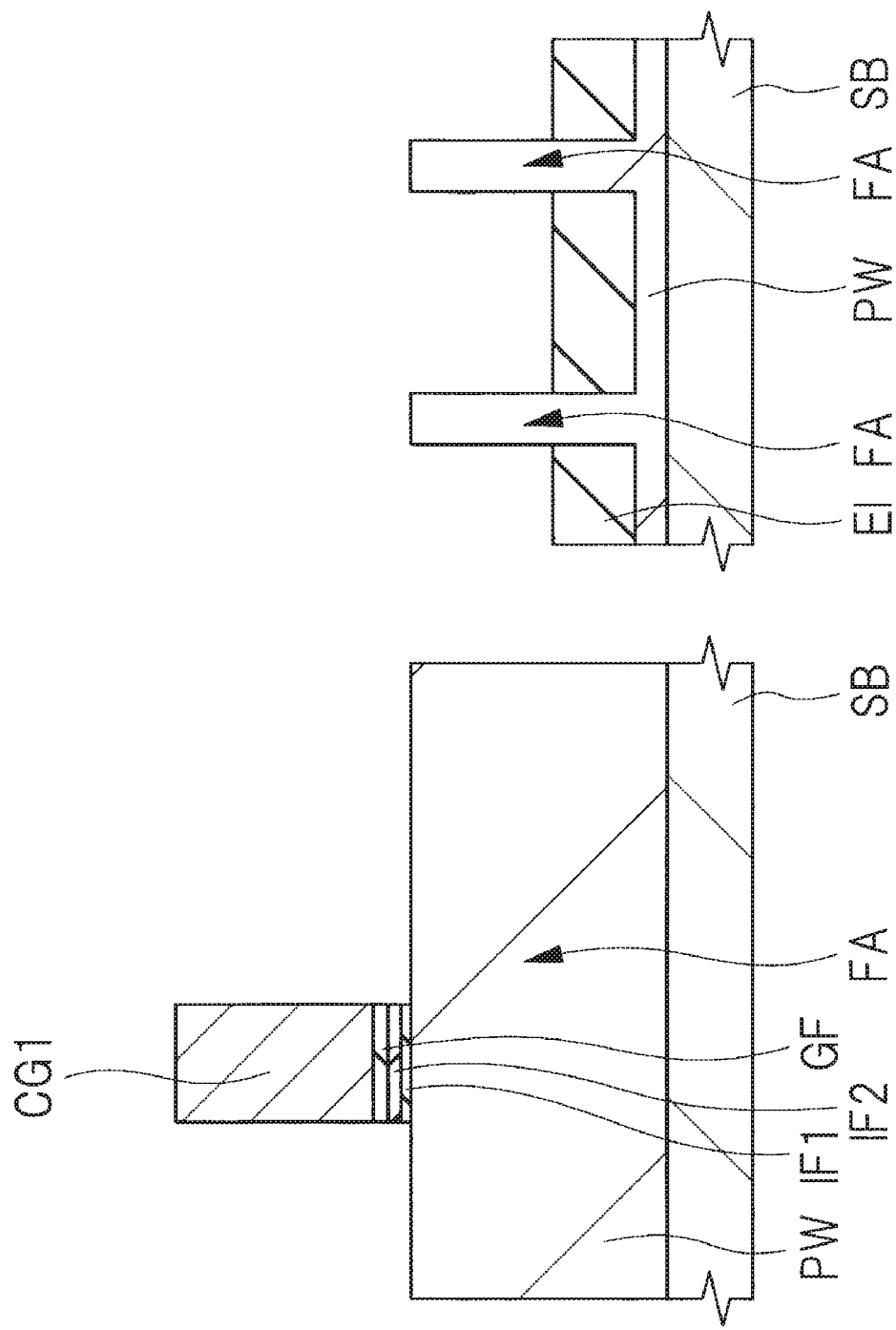
FIG. 11 is a cross-sectional view during the manufacturing step of the semiconductor device following FIG. 10.

Next, as shown in FIG. 11, the insulating films IF1 and IF2 exposed from the control gate electrode CG1 and the gate dielectric film GF are removed by, for example, performing an etching. As a result, the upper surfaces of the fins FA in the region not covered with the gate dielectric film GF and the control gate electrode CG1 are exposed.

Figure 12:
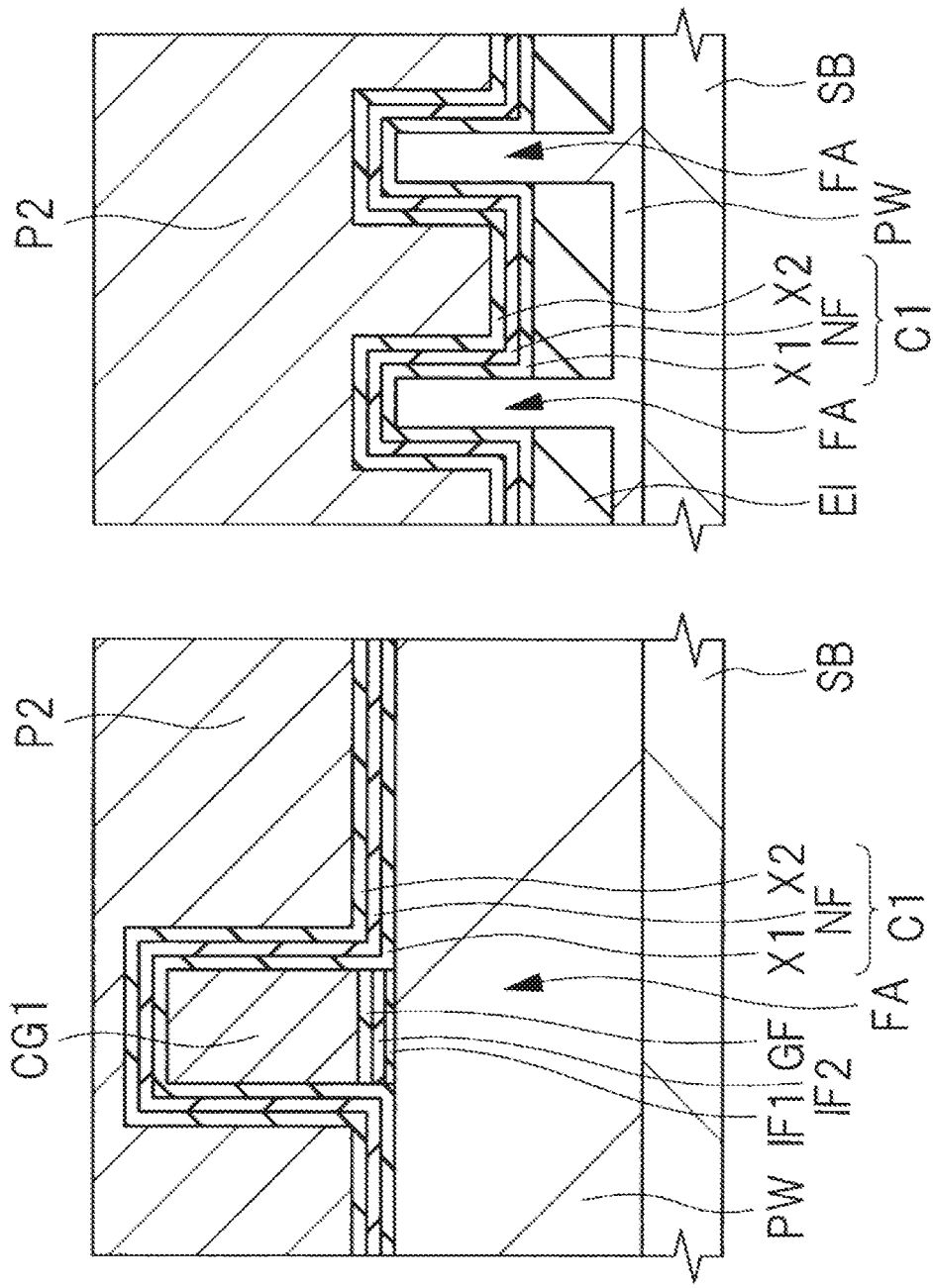
FIG. 12 is a cross-sectional view during the manufacturing step of the semiconductor device following FIG. 11.

Next, as shown in FIG. 12, a silicon oxide film (bottom oxide film) X1, a silicon nitride film (charge storage film) NF, a silicon oxide film (top oxide film) X2, and a polysilicon film P2 are sequentially formed on the entire main surface of the semiconductor substrate SB. The silicon oxide film X1 can be formed by, for example, a thermal oxidation method, and each of the silicon nitride film NF, the silicon oxide film X2, and the polysilicon film P2 can be formed by, for example, a CVD method. The thickness of the stacked film formed of the silicon oxide film X1, the silicon nitride film NF, and the silicon oxide film X2 is 15 nm to 25 nm, and the thickness of the polysilicon film P2 is 40 nm to 80 nm. The stacked film formed of the silicon oxide film X1, the silicon nitride film NF, and the silicon oxide film X2 constitutes an ONO film C1. The polysilicon film P2 is, for example, an n-type semiconductor film into which n-type impurities (for example, P (phosphorus)) are introduced.

As a result, the ONO film C1 and the polysilicon film P2 are sequentially stacked so as to cover the side surfaces and the upper surface of the stacked pattern formed of the gate dielectric film GF and the control gate electrode CG1 and the upper surface and the side surfaces of the fins FA.

Figure 13:
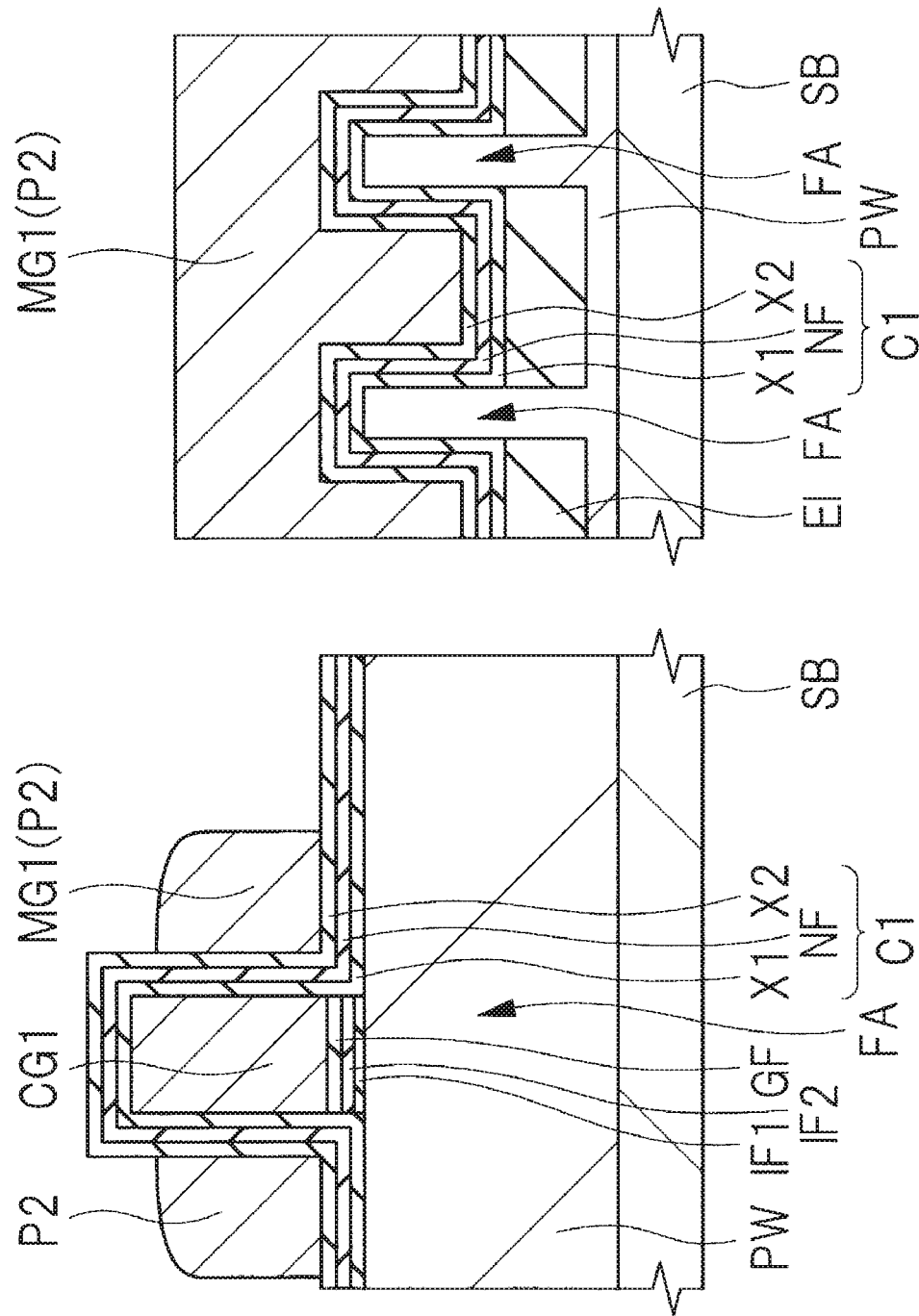
FIG. 13 is a cross-sectional view during the manufacturing step of the semiconductor device following FIG. 12.

Next, as shown in FIG. 13, the polysilicon film P2 is partially removed by, for example, a dry etching method to expose the upper surface of the silicon oxide film X2. That is, the polysilicon film P2 is etched back by anisotropic dry etching, thereby leaving the polysilicon film P2 only in the region adjacent to the side surfaces of the control gate electrode CG1 via the ONO film C1. Here, etching is sufficiently performed so that the polysilicon film P2 extending along the side surface of the control gate electrode CG1 is left and the polysilicon film P2 covering the side surface of the fin FA is not left in the other region. As a result, the upper surface of the polysilicon film P2 is lower than the upper surface of the control gate electrode CG1 adjacent to the polysilicon film P2.

On each of the side surfaces on both sides of the control gate electrode CG1, the polysilicon film P2 remains in the form of sidewall spacers via the ONO film C1. That is, the sidewall spacer-like polysilicon film P2 is formed in a self-aligned manner on the side surface of the control gate electrode CG1. The polysilicon film P2 adjacent to one side surface of the control gate electrode CG1 in the short side direction (X direction) constitutes a memory gate electrode MG1.

Figure 14:
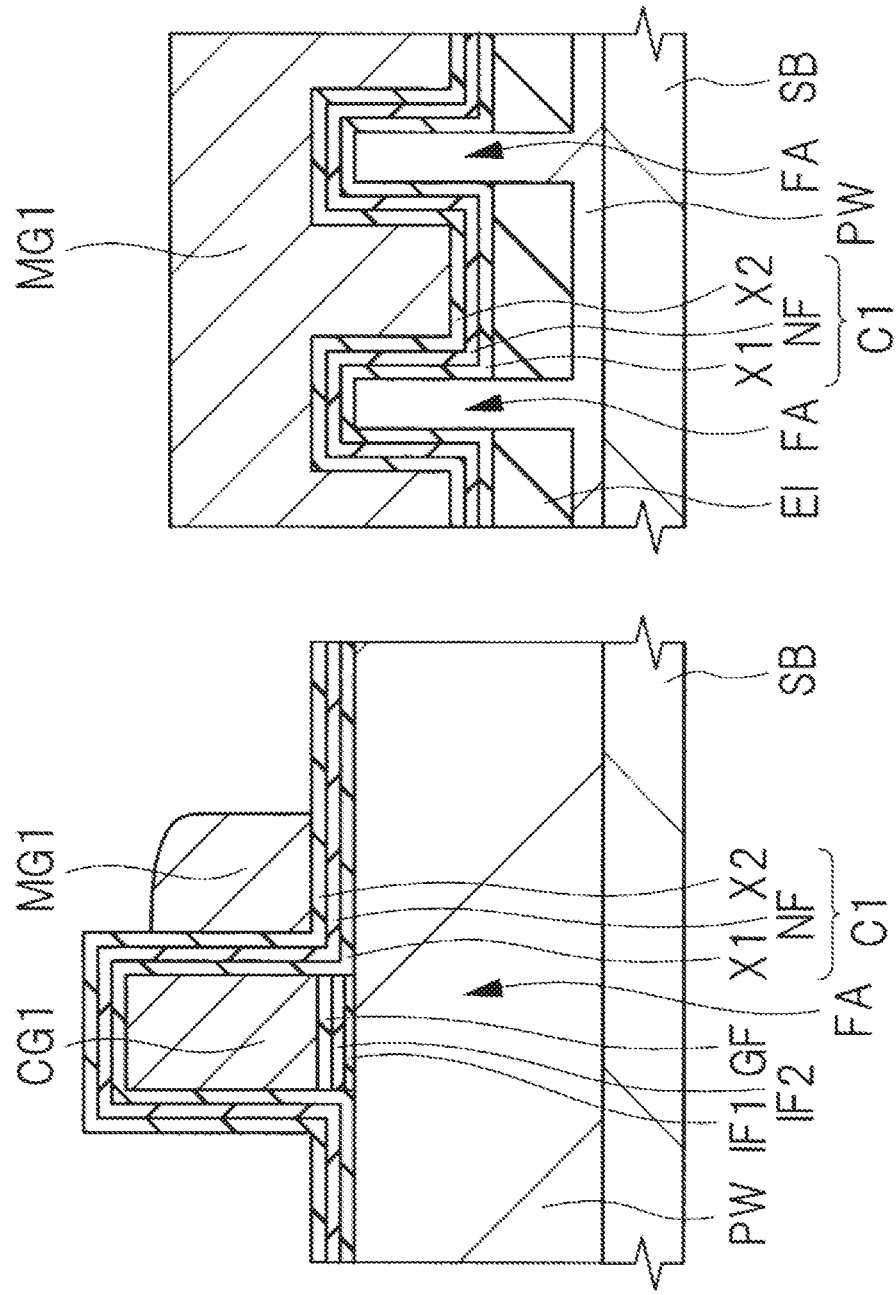
FIG. 14 is a cross-sectional view during the manufacturing step of the semiconductor device following FIG. 13.

Next, as shown in FIG. 14, the polysilicon film P2 adjacent to one side surface of the control gate electrode CG1 is removed by photolithography and wet etching method. At this time, the memory gate electrode MG1 is left without being removed.

Figure 15:
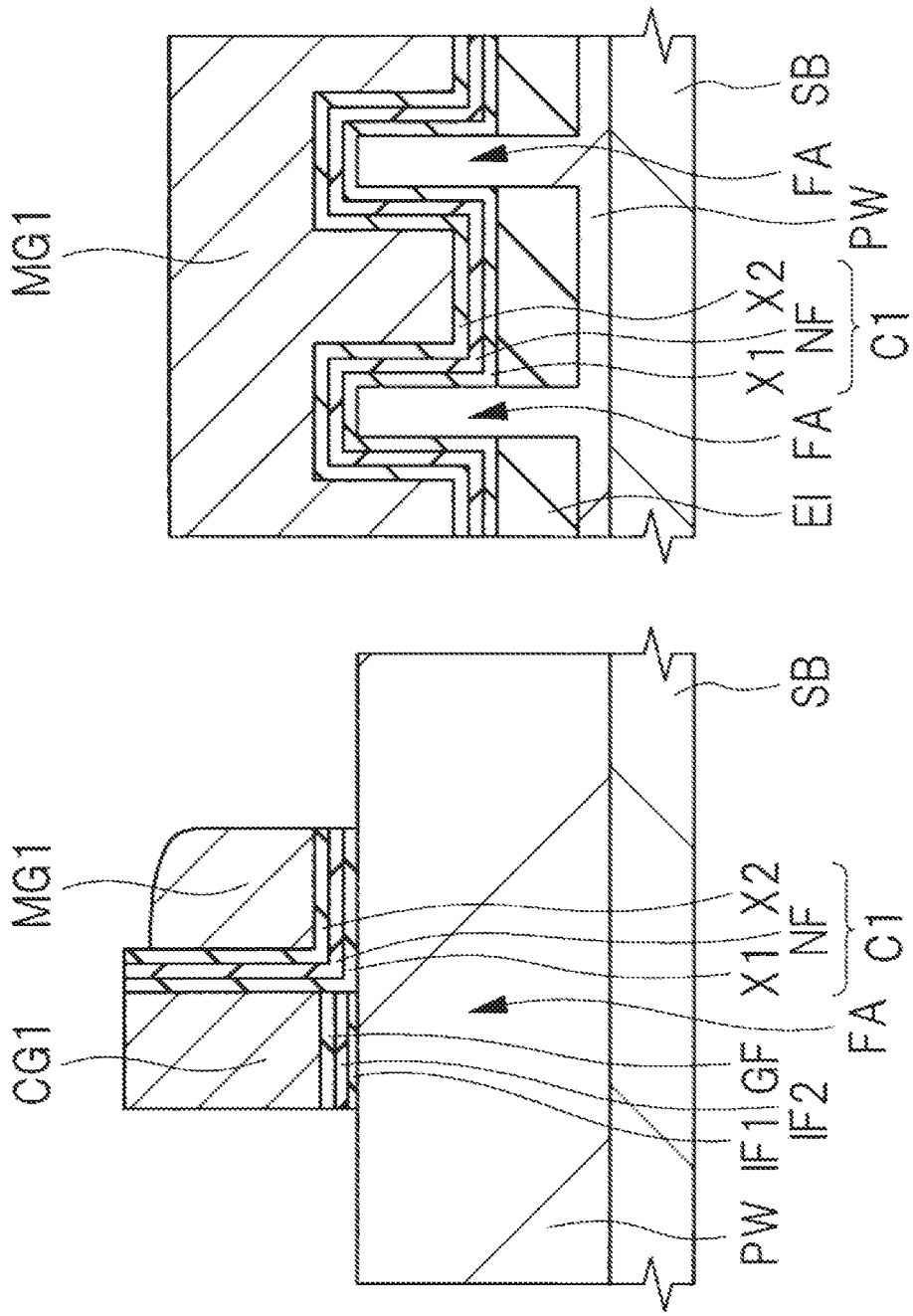
FIG. 15 is a cross-sectional view during the manufacturing step of the semiconductor device following FIG. 14.

Next, as shown in FIG. 15, the ONO film C1 is partially removed by wet etching method, for example, to expose the upper surface of the semiconductor substrate SB, and the upper surface and partial side surface of the control gate electrode CG1 and the insulating film IF2 from the ONO film C1. As a result, the ONO film C1 in the other region is removed except for the ONO film C1 in contact with the side surface and the bottom surface of the memory gate electrode MG1. The stacked pattern formed of the ONO film C1 and the memory gate electrode MG1 extend in the Y direction (in a depth direction in FIG. 15). That is, the stacked pattern covers the upper surface and the side surfaces of the fins FA, and is formed so as to straddle each of the plurality of fins FA arranged in the Y direction.

Figure 16:
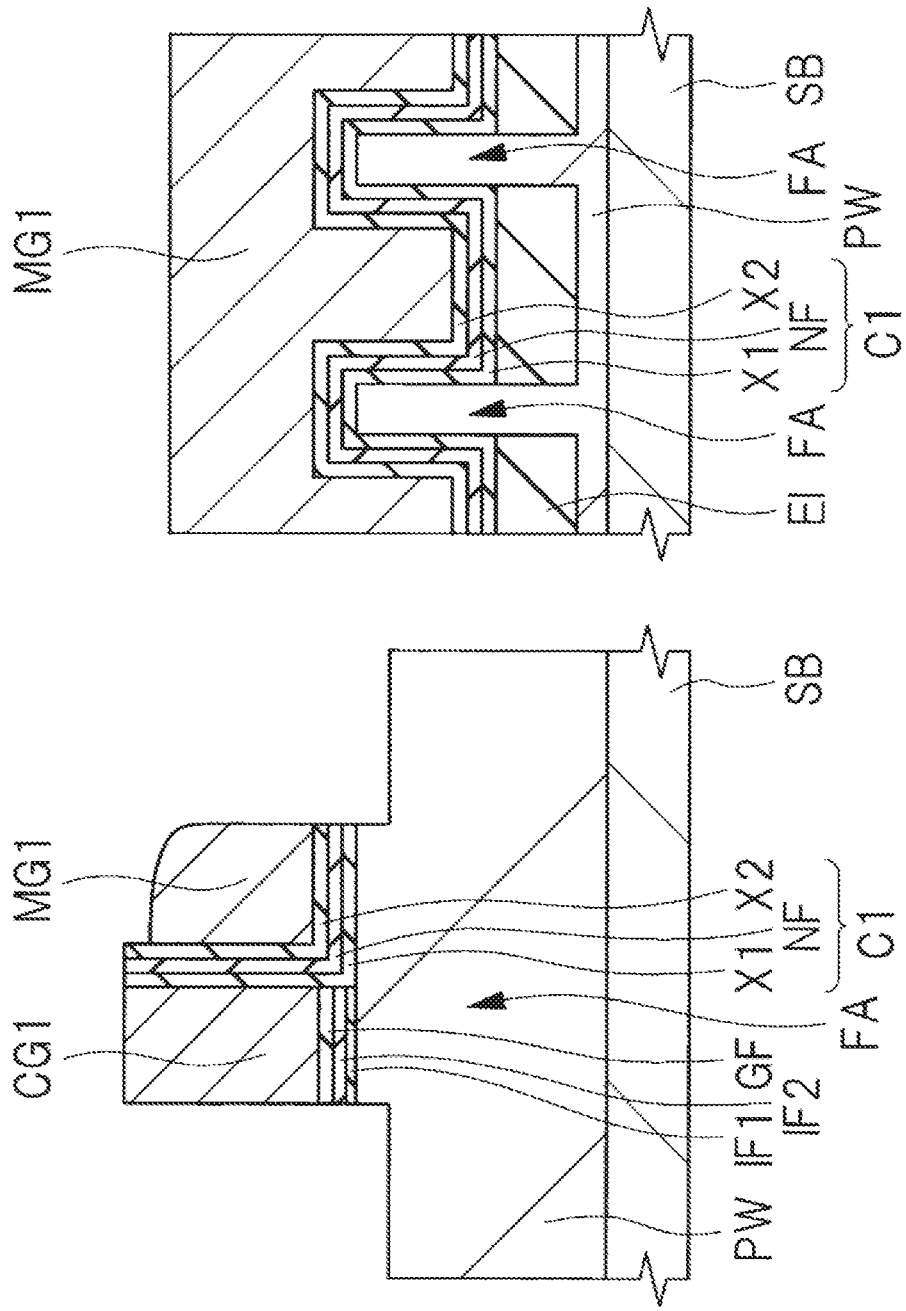
FIG. 16 is a cross-sectional view during the manufacturing step of the semiconductor device following FIG. 15.

Next, as shown in FIG. 16, anisotropic etching (for example, dry etching) is performed using the control gate electrode CG1, the ONO film C1, and the memory gate electrode MG1 as masks, whereby the upper surfaces of the fins FA exposed from the control gate electrode CG1, the ONO film C1, and the memory gate electrode MG1 is retracted downward. Here, for example, a part of the upper surface of the fins FA is retracted by 5 nm to 10 nm. At this time, although the first upper surface of the fin FA covered with the memory gate electrode MG1 is not retracted, the second upper surface of the fin FA adjacent to the memory gate electrode MG1 in the X-direction in plan view and exposed from the control gate electrode CG1, the ONO film C1, and the memory gate electrode MG1 retracts below the first upper surface. That is, the first upper surface in contact with the ONO film C1 and the second upper surface are spaced apart from each other. In the present embodiment, the third upper surface of the fin FA adjacent to the control gate electrode CG1 in the X direction in plan view and exposed from each of the control gate electrode CG1, the ONO film C1, and the memory gate electrode MG1 also retracts below the first upper surface.

Figure 17:
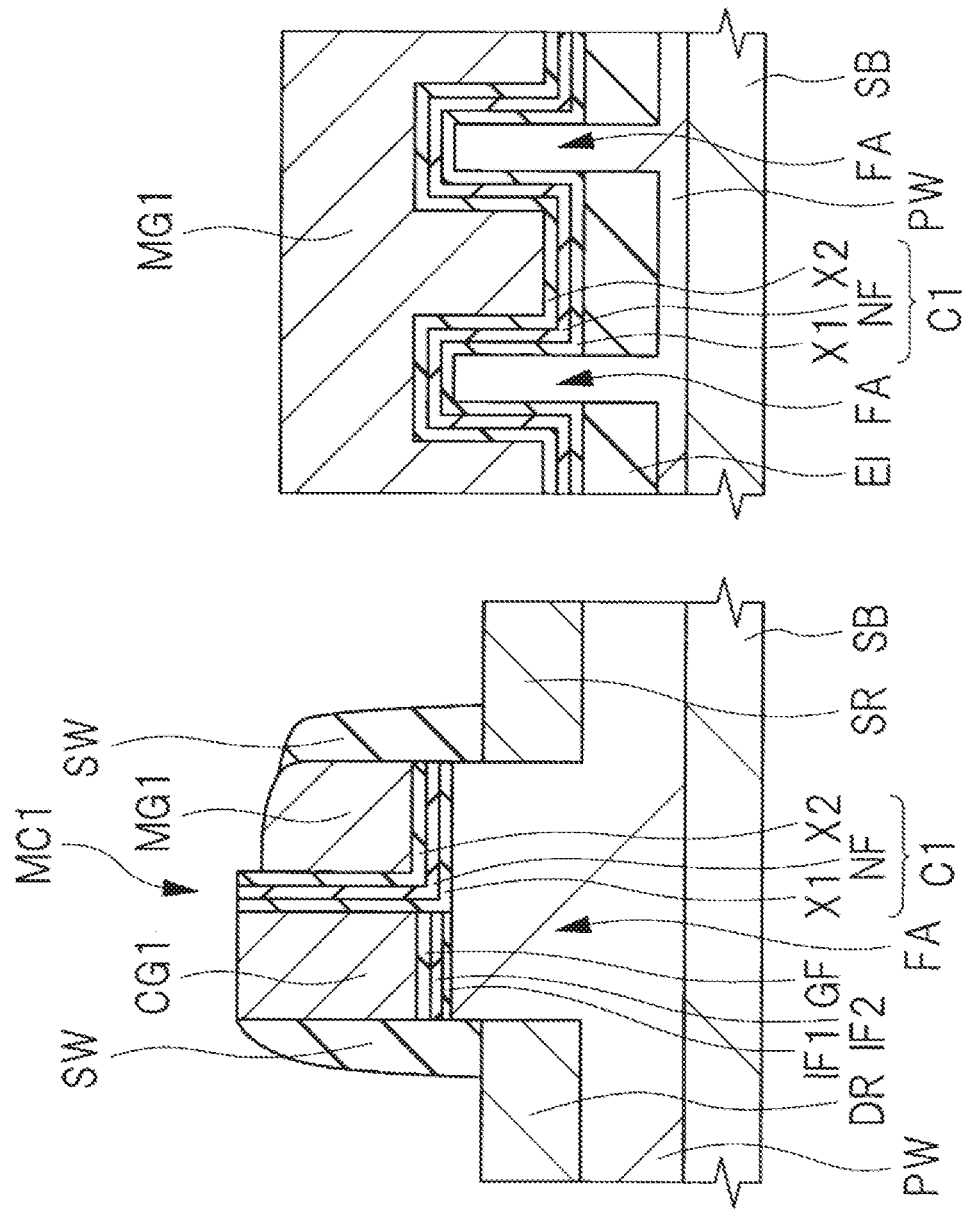
FIG. 17 is a cross-sectional view during the manufacturing step of the semiconductor device following FIG. 16.

Next, as shown in FIG. 17, an insulating film is formed on the entire main surface of the semiconductor substrate SB by, for example, a CVD method, and then the insulating film is partially removed by dry etching to expose the upper surface of the semiconductor substrate SB, thereby forming sidewall spacers SW formed of the insulating film. The sidewall spacers SW are formed in a self-aligned manner on one side surface of the control gate electrode CG1 and one side surface of the memory gate electrode MG1, respectively. The sidewall spacers SW are formed of, for example, a silicon oxide film or a stacked film of a silicon nitride film and a silicon oxide film, but in FIG. 17, the insulating films are not distinguished from each other, and the sidewall spacers SW are shown as one films.

The bottom surface of the sidewall spacers SW are in contact with the second upper surface and the third upper surface of the fin FA, and a part of the second upper surface of the fin FA and a part of the third upper surface of the fin FA are exposed from the sidewall spacers SW.

Thereafter, n-type impurities (for example, As (arsenic)) are implanted into the surface of the semiconductor substrate SB by ion implantation. Here, the control gate electrode CG1, the memory gate electrode MG1, the ONO film C1, the sidewall spacers SW, and the element isolation region EI are used as ion implantation blocking masks. Thus, n-type diffusion regions (diffusion layers) are formed on the upper surfaces and side surfaces of the fins FA in the region adjacent to the control gate electrode CG1 and the region adjacent to the memory gate electrode MG1. The diffusion region formed in the region adjacent to the control gate electrode CG1 in the X direction in plan view constitutes a drain region DR, and the diffusion region formed in the region adjacent to the memory gate electrode MG1 in the X direction in plan view constitutes a source region SR.

That is, a source region SR and a drain region DR, which are n-type semiconductor regions, are respectively formed in the fin FA including the upper surface and the side surfaces of the fin FA. A part of the drain region DR is formed in the third upper surface of the fin FA, and a part of the source region SR is formed in the second upper surface of the fin FA. However, the source region SR is not formed in the first upper surface of the fin FA, and the entire source region SR is formed at a position spaced downward from the first upper surface.

Before the sidewall spacers SW are formed, an extension region which is an n-type semiconductor region may be formed in the fin FA. The extension region is a semiconductor region having an impurity concentration lower than that of the diffusion region. The extension region can be formed by implanting n-type impurities (for example, As (arsenic)) into the fin FA by an ion implantation method, for example. The extension region is formed inside the fin FA including the upper surface and the side surfaces of the fin FA in contact with the diffusion region constituting the drain region DR, for example.

Through the above steps, a memory cell MC1 having the control gate electrode CG1, the memory gate electrode MG1 adjacent to the side surface of the control gate electrode CG1 via the ONO film C1, and the source region SR and the drain region DR formed in the fin FA so as to sandwich the pattern including the control gate electrode CG1 and the memory gate electrode MG1 is formed on the semiconductor substrate SB. That is, the control gate electrode CG1, the source region SR, and the drain region DR constitute a control transistor, the memory gate electrode MG1, the source region SR, and the drain region DR constitute a memory transistor, and the memory cell MC1 is formed of a control transistor and a memory transistor. The memory cell MC1, which is a MONOS memory, has a silicon nitride film NF serving as a charge storage film (charge storage portion) in the ONO film C1.

Figure 18:
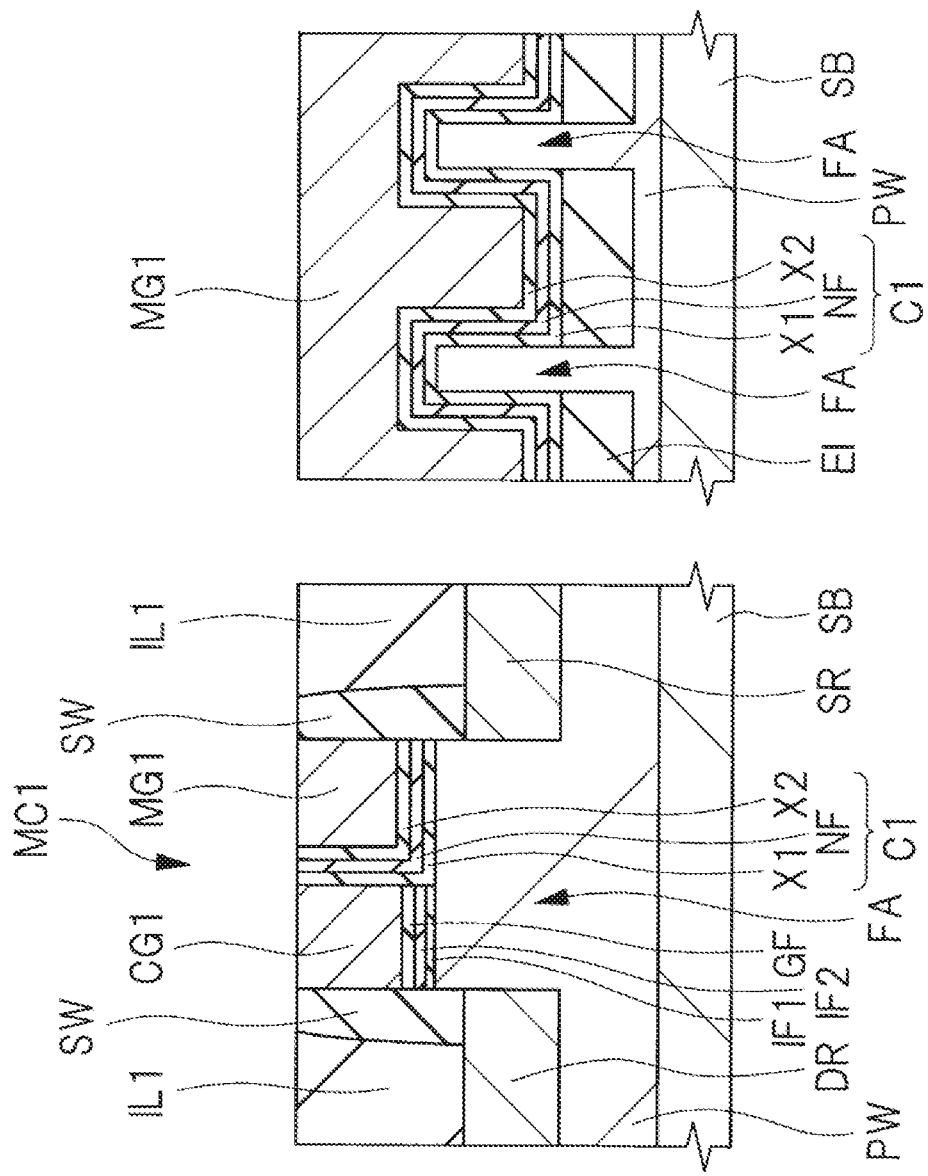
FIG. 18 is a cross-sectional view during the manufacturing step of the semiconductor device following FIG. 17.

Next, as shown in FIG. 18, a thin liner film (not shown) formed of, for example, a silicon nitride film and a thick interlayer insulating film IL1 formed of, for example, a silicon oxide film are sequentially formed on the entire surface of the upper surface of the semiconductor substrate SB by a CVD method or the like. Subsequently, the upper surface of the interlayer insulating film IL1 is polished and planarized by using, for example, a Chemical Mechanical Polishing (CMP) method. At this time, the upper surface of each of the control gate electrode CG1, the memory gate electrode MG1, the ONO film C1, and the sidewall spacers SW is exposed.

Although not described here, an epitaxial growth layer (semiconductor layer) may be formed on each of the source region SR and the drain region DR by using an epitaxial growth method after the formation of the source region SR and the drain region DR and before the formation of the interlayer insulating film IL1. Also, although not described here, a silicide layer may be formed to cover the surface of each of the source region SR, the drain region DR, the control gate electrode CG1, and the memory gate electrode MG1 before the formation of the interlayer insulating film IL1. When the epitaxial layer is formed, the silicide layer electrically connected to each of the source region SR and the drain region DR is formed so as to cover the surface of the epitaxial layer. The silicide layer is formed to reduce a connection resistance between a plug (contact plug) to be described later and semiconductor layers such as source/drain regions and each of gate electrodes.

Figure 19:
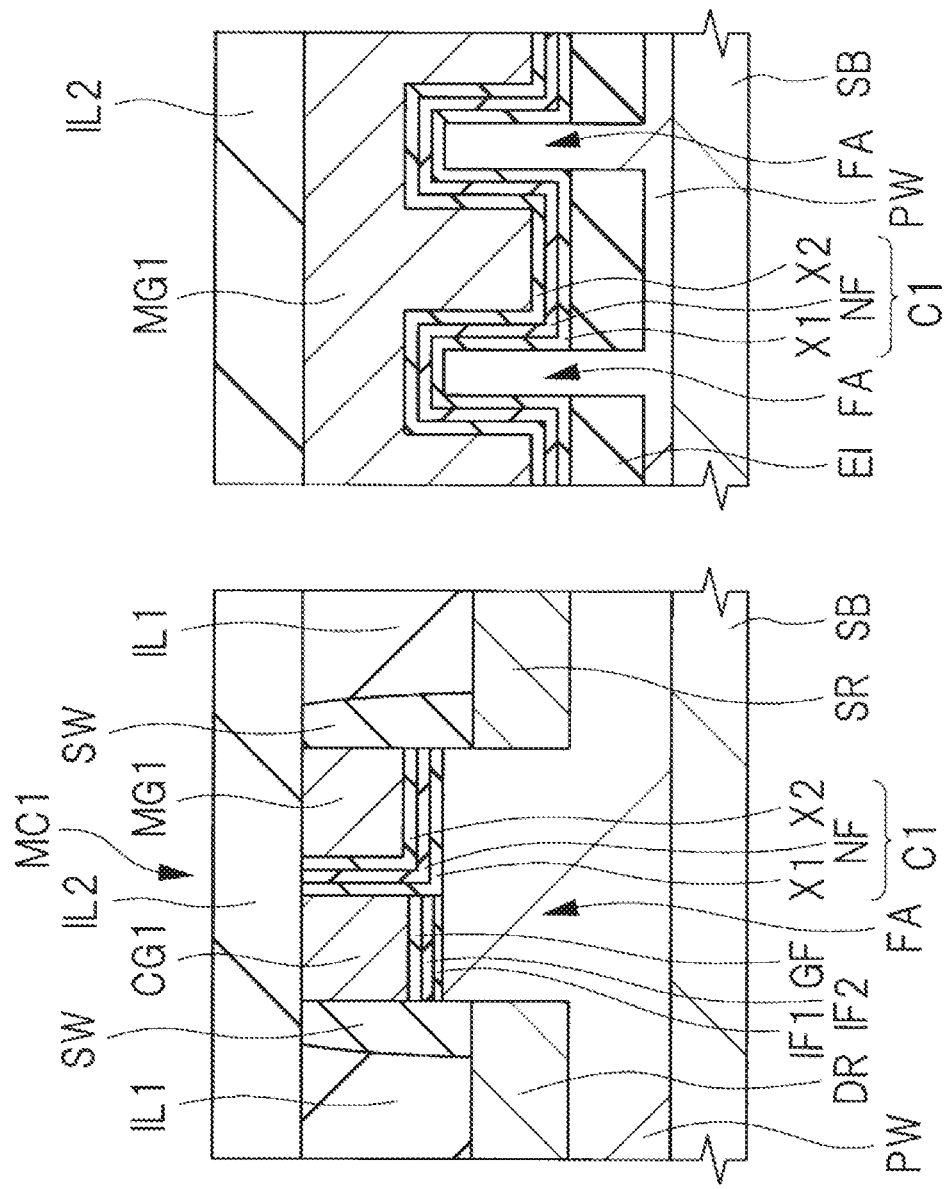
FIG. 19 is a cross-sectional view during the manufacturing step of the semiconductor device following FIG. 18.

Next, as shown in FIG. 19, an interlayer insulating film IL2 formed of, for example, a silicon oxide film is formed on the entire surface of the upper surface of the semiconductor substrate SB by a CVD method or the like, thereby covering each upper surface of the control gate electrode CG1, the memory gate electrode MG1, the ONO film C1, and the sidewall spacers SW.

The reason why the second interlayer insulating film IL2 is formed as described with reference to FIG. 19 after each of the gate electrodes is exposed by a CMP process described with reference to FIG. 18 is that, for example, a gate electrode of a transistor formed in a logic circuit region other than the memory cell region in which the memory cell MC1 is formed is replaced with a metal gate electrode. That is, after each gate electrode is exposed, the gate pattern of the field effect transistor in the logic circuit region is removed, and a gate electrode formed of a metal film is filled in the trench formed thereby, whereby a transistor having a low gate resistance can be formed. Although the replacement with the metal gate electrode is not performed in the memory cell region, the control gate electrode CG1 and the memory gate electrode MG1 may be replaced with the metal gate electrode before the formation of the interlayer insulating film IL2.

Figure 20:
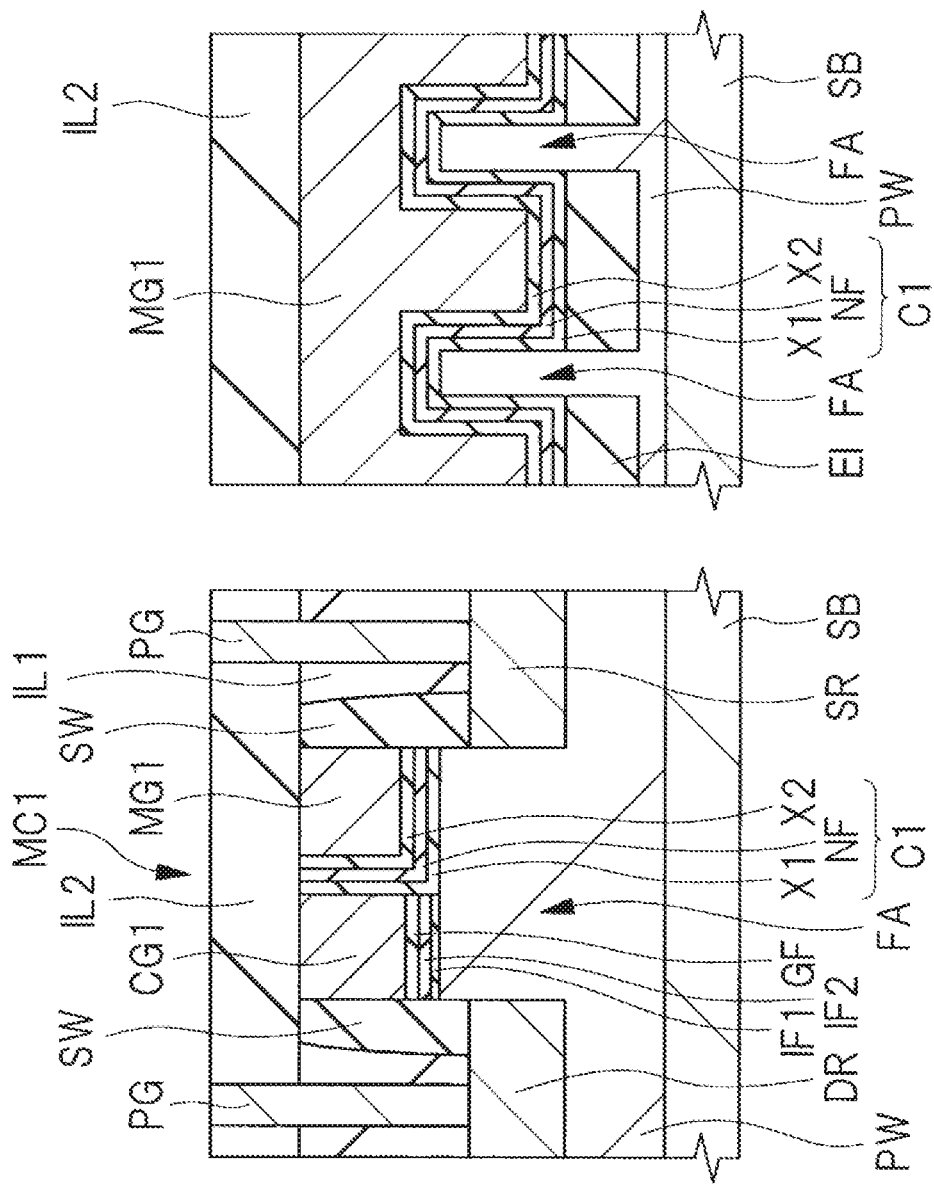
FIG. 20 is a cross-sectional view during the manufacturing step of the semiconductor device following FIG. 19.

Next, as shown in FIG. 20, a plurality of contact holes are formed through the interlayer insulating film IL1 and the liner film (not shown) by photolithography and a dry etching method. By forming a plurality of contact holes, the upper surface of each of the source region SR, the drain region DR, the control gate electrode CG1, and the memory gate electrode MG1 is exposed from the interlayer insulating films IL1, IL2, and the liner film. The contact holes directly above the control gate electrode CG1 and the memory gate electrode MG1 are formed in a region not shown in FIG. 20.

Subsequently, a tungsten (W) film, for example, is filled in each of the plurality of contact holes via a barrier conductor film containing titanium (Ti), for example, and then the excess conductive film on the interlayer insulating film IL2 is removed. Thus, plugs PG including a barrier conductor film and a tungsten film filled in each contact hole is formed. Each of the plugs PG is a conductor formed to supply a predetermined potential to the source region SR, the drain region DR, the control gate electrode CG1, the memory gate electrode MG1, or the semiconductor substrate SB.

In a specific manufacturing process of forming the plugs PG, first, the above-mentioned barrier conductor film (not shown) is formed on the entire surface of the upper surface of the semiconductor substrate SB by using a sputtering method or the like, and the surfaces in the contact holes are covered with the barrier conductor film. Thereafter, a tungsten film (main conductor film) is formed on the semiconductor substrate SB by using a sputtering method or the like, and the inside of each of the plurality of contact holes is completely filled with the tungsten film. Subsequently, the upper surface of the interlayer insulating film IL2 is exposed by removing an excess of the barrier conductor film and the tungsten film on the interlayer insulating film IL2 by a CMP method or the like. As a result, the upper surface of the interlayer insulating film IL2 and the tungsten film is planarized, and the plug PG formed of the barrier conductor film and the tungsten film is formed in each of the contact holes.

Figure 21:
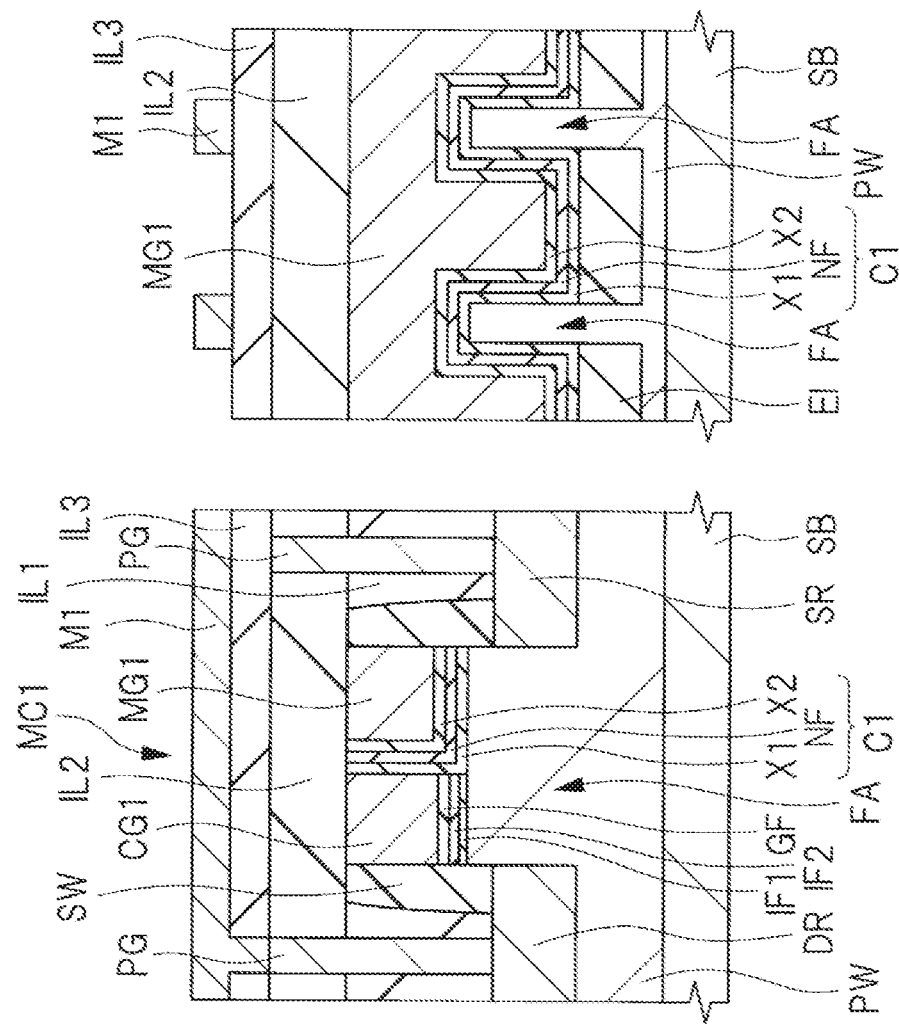
FIG. 21 is a cross-sectional view during the manufacturing step of the semiconductor device following FIG. 20.

Next, as shown in FIG. 21, a wiring layer is formed. That is, an interlayer insulating film IL3 formed of a silicon oxide film or the like is formed on the interlayer insulating film IL2 by, for example, a CVD method. Thereafter, a plurality of via holes are formed through the interlayer insulating film IL3 to expose the upper surfaces of the plugs PG by photolithography and a dry etching method. Subsequently, the via holes are completely filled with a metal film formed on the interlayer insulating film IL3 by a sputtering method or the like, and then the metal film on the interlayer insulating film IL3 is patterned to form a wiring M1 formed of the metal film on the interlayer insulating film IL3.

Unlike the above formation method, the wiring M1 may be formed by a so-called dual damascene method. In addition, although not shown in FIG. 21, it is actually conceivable to form the wiring covering the upper surfaces of the plugs PG by using, for example, a so-called single damascene method. The wiring M1 corresponds to the wiring MW (bit line BL) shown in FIG. 1.

In a subsequent step, upper layer wirings (not shown) are formed by stacking a plurality of wiring layers including a wiring and via holes filled in the interlayer insulating film on the interlayer insulating film IL3, and the semiconductor device of the present embodiment is substantially completed.

Here, it has been described that after the control gate electrode CG1 and the memory gate electrode MG1 are formed, a part of the upper surfaces of the fins FA, which is a portion where the source/drain regions are to be formed, is retracted, as shown in FIG. 16. On the other hand, a part of the upper surfaces of the fins FA may be retracted before the formation of the control gate electrode CG1 or the memory gate electrode MG1 by photolithography or a dry etching method.

Effect of Method of Manufacturing Semiconductor Device of Present Embodiment

In the method of manufacturing the semiconductor device according to the present embodiment, in the MONOS memory of the split-gate type formed of FINFET, by forming source region SR spaced downward from the first upper surface of fin FA directly below the memory gate electrode MG1, the same effects as the effects of the semiconductor device described with reference to FIGS. 5, 6, 34 and 35 can be obtained.

That is, by spacing the source region downward from the first upper surface of the fin where the electric field tends to concentrate, local injections of charges into the ONO film can be avoided in both the write operation and the erase operation. Therefore, it is possible to prevent deterioration of rewrite resistance and deterioration of retention characteristics caused by local charge injection. Therefore, the number of rewritable times (lifetime) of the nonvolatile memory element can be increased, so that the performance of the semiconductor device can be improved.

Here, the third upper surface of the fin FA in which the drain region DR is formed and the second upper surface of the fin FA in which the source region SR is formed are retracted in the same step. Therefore, there is no need to form a photoresist film for protecting the third upper surface from retracting, so that the manufacturing step of the semiconductor device can be simplified.

Modification

Figure 22:
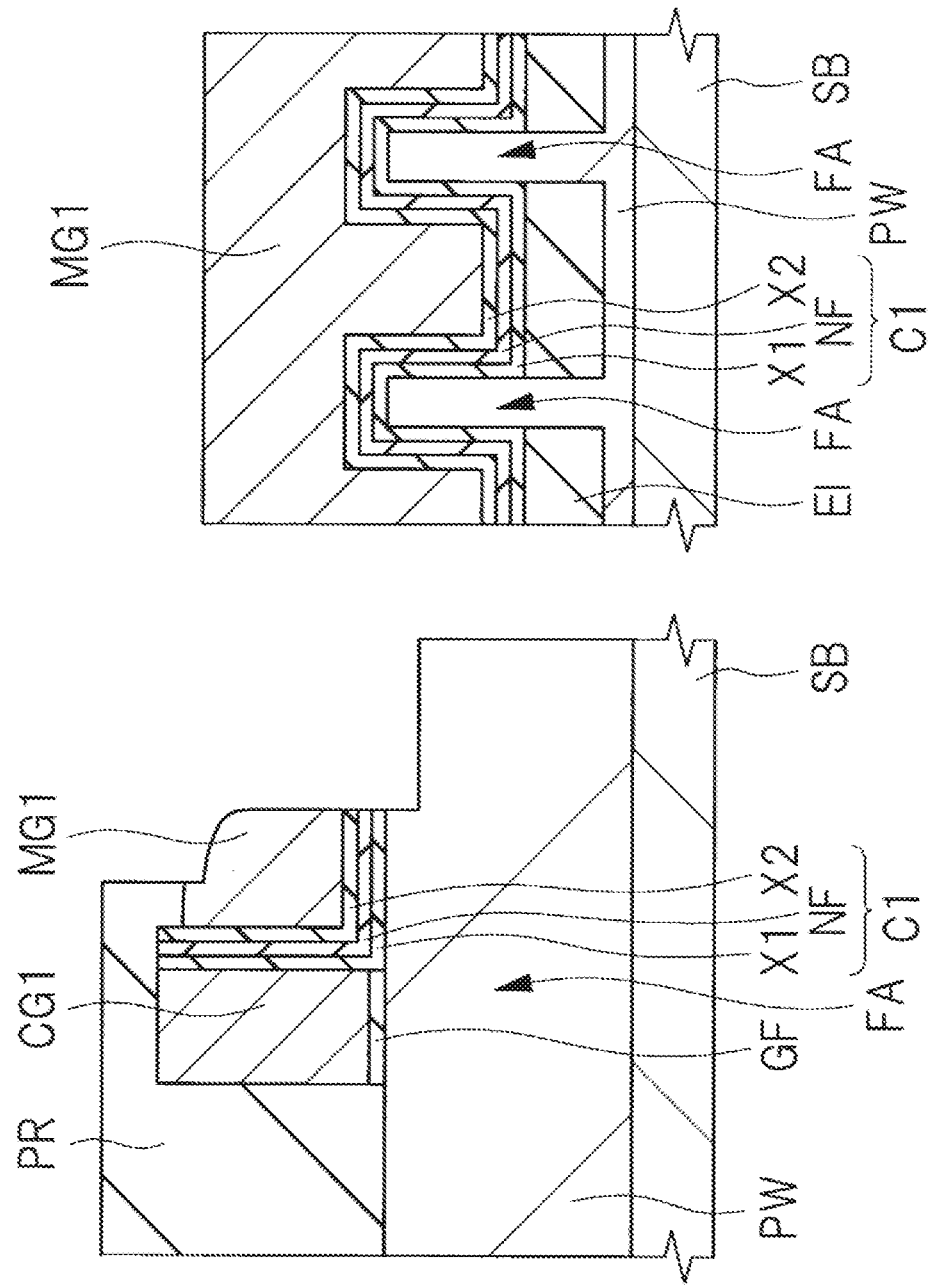
FIG. 22 is a cross-sectional view during the manufacturing step of a semiconductor device according to modification of the first embodiment.
Figure 23:
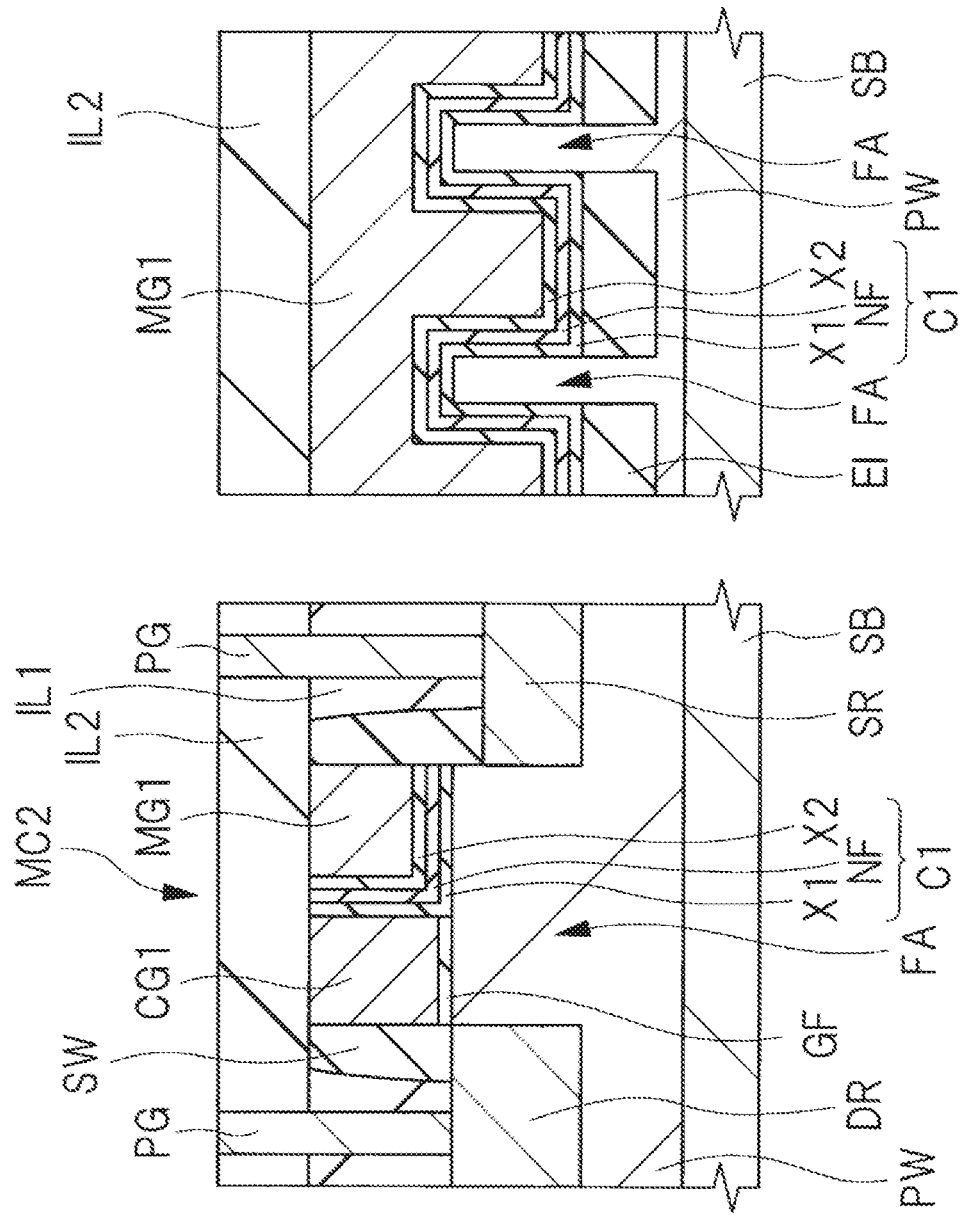
FIG. 23 is a cross-sectional view during the manufacturing step of the semiconductor device following FIG. 22.

Since the main characteristic of the present embodiment is that the source region SR is formed to be spaced apart from the first upper surface of the fin directly below the memory gate electrode, the drain region SR does not need to be spaced apart from the drain region SR below the first upper surface. In the present modification, a structure in which only the second upper surface of the fin in which the source region is formed is retracted downward and the third upper surface of the fin in which the drain region is formed is not retracted downward will be described with reference to FIGS. 22 and 23. FIGS. 22 and 23 are cross-sectional view during the manufacturing step of the semiconductor device, which is the modification of the present embodiment. Here, a showing of the interlayer insulating film IL3 and the wiring M1 (see FIG. 21) on the plug and the explanation of the forming process are omitted.

In the manufacturing step of the semiconductor device of the present modification, first, the same steps as the steps described with reference to FIGS. 7 to 15 is performed. As a result, a control gate electrode CG1, a memory gate electrode MG1, and an ONO film C1, which straddle the fin, are formed.

Next, as shown in FIG. 22, a resist pattern formed of a photoresist film (protective film) PR is formed on the semiconductor substrate SB. The photoresist film PR is a resist pattern covering the upper surface (third upper surface) of the fin FA that is adjacent to the control gate electrode CG1 in the X-direction and is exposed from the control gate electrode CG1, the memory gate electrode MG1, and the ONO film C1. Here, the photoresist film PR continuously covers the upper surface of the control gate electrode CG1, the upper surface of the ONO film C1, and a part of the upper surface of the memory gate electrode MG1, and exposes another part of the upper surface of the memory gate electrode MG1. The photoresist film PR exposes the upper surface (second upper surface) of the fins FA adjacent to the memory gate electrode MG1 in the X-direction and exposed from the control gate electrode CG1, the memory gate electrode MG1, and the ONO film C1.

Subsequently, a dry etching is performed using the photoresist film PR as a mask, whereby the second upper surface of the upper surface of the fin FA, which is adjacent to the memory gate electrode MG1 in the X-direction and exposed from the control gate electrode CG1, the memory gate electrode MG1, and the ONO film C1, is retracted downward. At this time, since the third upper surface of the fin FA is protected by the photoresist film PR, the third upper surface is not retracted. Since the upper surface of the control gate electrode CG1, the upper surface of the ONO film C1, and a part of the upper surface of the memory gate electrode MG1 are covered with the photoresist film PR, the upper surfaces are not retracted by the dry etching. Since the other part of the upper surface of the memory gate electrode MG1 is retracted, a step is formed on the upper surface of the memory gate electrode MG1.

Next, as shown in FIG. 23, the semiconductor device of the present modification including the memory cell MC2 is substantially completed by performing the steps described with reference to FIGS. 17 to 20. The memory cell MC2 has the source region SR, the drain region DR, the control gate electrode CG1, and the memory gate electrode MG1. The structure of the memory cell MC2 differs from the structure of the memory cell MC1 shown in FIG. 3 in that the third upper surface of the fin FA in which a part of the drain region DR is formed is located at the same height as the first upper surface of the fin FA directly below the memory gate electrode MG1 and is not retracted with respect to the first upper surface. That is, the upper surface of the source region SR is lower than the upper surface of the drain region DR. In the step described with reference to FIG. 22, a step is formed on the upper surface of the memory gate electrode MG1, but the upper surface of the memory gate electrode MG1 is planarized by the planarization process (polishing process by a CMP method) described with reference to FIG. 18.

In the present modification, the same effects as those of the embodiment described with reference to FIGS. 1 to 21 can be obtained. Further, in the present modification, since the upper surface of the fin FA in the region where the drain region DR is formed is not retracted, the total thickness of the interlayer insulating films IL1 and IL2 on the drain region DR can be reduced. Therefore, the height (thickness or depth) of the plug PG formed on the drain region DR can be reduced. Since the contact hole in which the plug PG is filled needs to be opened with a large diameter when the film thickness of the interlayer insulating film penetrating therethrough is large, the diameter of the contact hole can be reduced by reducing the film thickness of the interlayer insulating film. That is, in the present modification, the degree of flexibility in forming the plug PG on the drain region DR can be increased.

Second Embodiment

Figure 24:
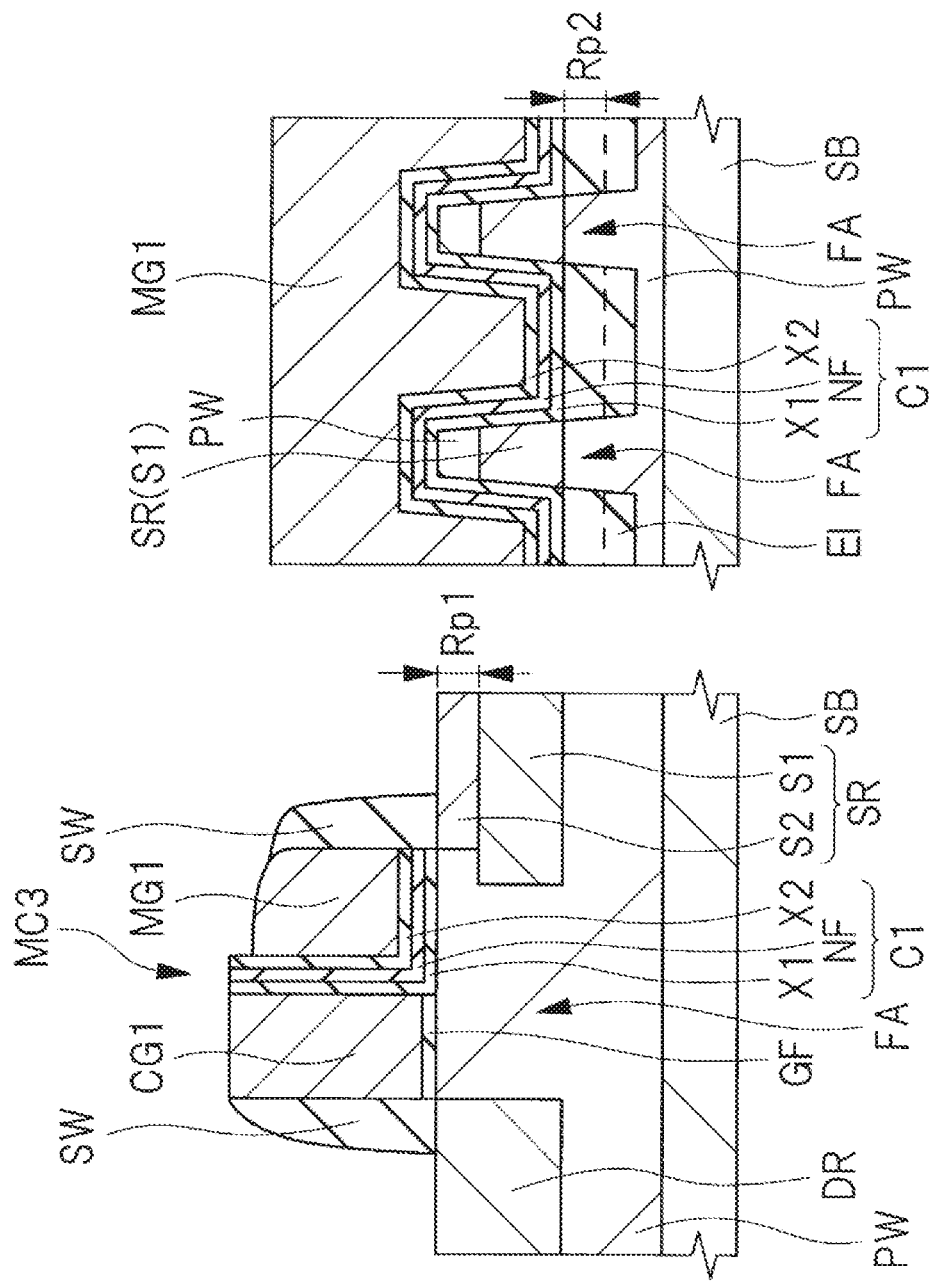
FIG. 24 is a cross-sectional view during the manufacturing step of a semiconductor device according to second embodiment.
Figure 25:
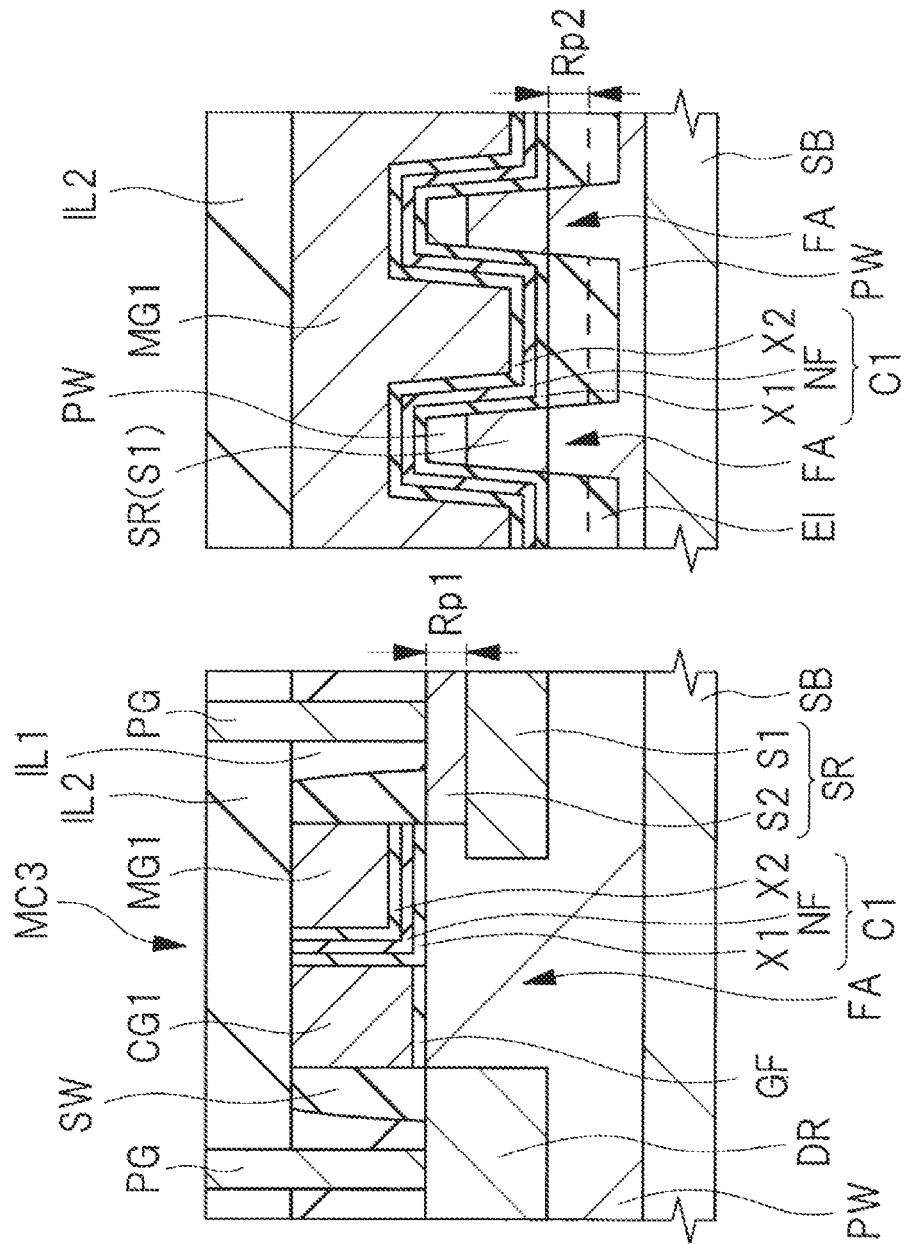
FIG. 25 is a cross-sectional view during the manufacturing step of the semiconductor device following FIG. 24.

In the above first embodiment, it has been described that the upper surface of the fin at the place where the source region is to be formed is retracted to space the source region apart from the upper surface of the fin directly below the memory gate electrode. Hereinafter, a method of spacing the source region apart from the upper surface of the fin directly below the memory gate electrode by changing the ion implantation method or the like without retracting the upper surface of the fin will be described with reference to FIGS. 24 and 25. FIGS. 24 and 25 are cross-sectional view during the manufacturing step of the semiconductor device of the present second embodiment. Here, a showing of the interlayer insulating film IL3 and the wiring M1 (see FIG. 21) on the plug and the explanation of the forming process are omitted.

Here, as shown in FIGS. 24 and 25, the side surfaces of the fins FA are tapered with respect to the upper surface of the semiconductor substrate SB. That is, the fin FA has a trapezoidal cross-sectional structure in which the width of the lower end is larger than the width of the upper end.

In the manufacturing step of the semiconductor device of the present embodiment, first, the same steps as the steps described with reference to FIGS. 7 to 15 is performed. As a result, a control gate electrode CG1, a memory gate electrode MG1, and an ONO film C1, which straddle the fin, are formed.

Next, as shown in FIG. 24, sidewall spacers SW are formed to cover each of the side surfaces of the pattern including the control gate electrode CG1 and the memory gate electrode MG1. The sidewall spacers SW can be formed by a method similar to the method for forming the sidewall spacers SW described with reference to FIG. 16.

Subsequently, using the control gate electrode CG1, the memory gate electrode MG1, the ONO film C1 and the sidewall spacers SW as masks (ion implantation blocking masks), n-type impurities (for example, As (arsenic)) are implanted into the fin FA to form the drain region DR and the source region SR, respectively. Here, a photoresist film (not shown) is used, and the drain region DR and the source region SR are formed by separate ion implantation processes. Either the source region SR or the drain region DR may be formed first.

The source region SR is formed by two or more ion implantation processes. That is, in the first ion implantation, the first diffusion region S1 is formed between the position of the fin FA in the depth Rp1 from the upper surface of the fin FA and the region deeper than the position of the fin FA in the depth Rp1 by performing ion implantation with relatively large energies. That is, the first diffusion region S1 is formed to be spaced apart from the upper surface of the fin FA. Further, in the second ion implantation, the second diffusion region S2 is formed from the upper surface of the fin FA to the first diffusion region S1 by performing ion implantation with relatively low energies. That is, in the second ion implantation, the second diffusion region S2 having the depth Rp1 is formed on the upper surface of the fin FA.

The first diffusion region S1 and the second diffusion region S2 may be in contact with each other, and a part of the second diffusion region S2 may overlap with a part of the first diffusion region S1. The second diffusion region S2 is formed at a position farther away from the region directly below each of the control gate electrode CG1 and the memory gate electrode MG1 than the first diffusion region S1. In other words, the first diffusion region S1 is formed at a position closer to a region directly below each of the control gate electrode CG1 and the memory gate electrode MG1 than the second diffusion region S2 on the first diffusion region S1. The source region SR is formed of the first diffusion region S1 and the second diffusion region S2. The second diffusion region S2 may be formed before the formation of the first diffusion region S1. The first diffusion region S1 and the second diffusion region S2 have, for example, the same impurity concentration.

The end portion of the first diffusion region S1 on the drain region DR side located below the second diffusion region S2 is located closer to the drain region DR side in the X direction (gate length direction) than the end portion of the second diffusion region S2 on the drain region DR side. That is, in plan view, the end portion of the first diffusion region S1 on the drain region DR side is formed on the memory gate electrode MG1 side than the end portion of the second diffusion region S2 on the drain region DR side. The second diffusion region S2 is not formed directly below the memory gate electrode MG1. That is, the source region SR is formed to be spaced apart from the first upper surface of the fin FA directly below the memory gate electrode MG1. Here, a part of the source region SR (first diffusion region S1) is located directly below the memory gate electrode MG1, but the entire source region SR may be spaced apart from a region directly below the memory gate electrode MG1 in the X direction.

As described above, in the source region SR, the portion formed deeper than the upper surface of the fin FA (the first diffusion region S1) is formed at a position closer to the drain region DR than the portion formed on the upper surface of the fin FA (the second diffusion region S2) and the source region SR is not formed on the first upper surface of the fin FA directly below the memory gate electrode MG1.

Although the first diffusion region S1 and the second diffusion region S2 are formed by a plurality of ion implantation processes as a method of forming such a structure, the source region SR may be formed by using, for example, a diagonal ion implantation method. That is, the source region SR may be formed by ion implantation into the upper surface of the fin FA from a diagonal direction to the upper surface (main surface) of the semiconductor substrate SB and the upper surface of the fin FA. More specifically, n-type impurity ions are implanted into the upper surface (second upper surface) of the fin FA from diagonal directions to both the side surface of the memory gate electrode MG1 opposite to the side surface of the control gate electrode CG1 and the upper surface of the fin FA. As a result, the portion formed deeper than the upper surface of the fin FA is formed at a position closer to the drain region DR than the portion formed at the upper surface of the fin FA, and the source region SR spaced apart from the first upper surface of the fin FA directly below the memory gate electrode MG1 can be formed. In other words, the end portion of the source region SR on the drain region DR side is located closer to the drain region DR side than the source region SR on the second upper surface of the fin FA.

FIG. 24 shows a depth Rp2 in which n-type impurities are implanted into the element isolation region EI in the ion implantation process for forming the first diffusion region S1. In FIG. 24, the upper surface of the region in which the n-type impurities are implanted in the element isolation region EI is indicated by a broken line. The respective sizes of the depths Rp1 and Rp2 are equal to each other, for example. The depth Rp1 is, for example, 5 nm to 10 nm. The impurity concentration of the first diffusion region S1 and the second diffusion region S2 is, for example, $1 \times 10^{18}/cm^3$ or more, and the impurity concentration in the fin FA in the region between the first diffusion region S1 and the memory gate electrode MG1, that is, the region where the source region SR is not formed, is, for example, less than $1 \times 10^{18}/cm^3$. In other words, although the source region SR can be regarded as a conductor, a region between the first diffusion region S1 and the memory gate electrode MG1, in which the second diffusion region S2 is not formed, has a high resistance and cannot be regarded as a conductor. In other words, although the source region SR is a region in which holes are generated during the erase operation, a region between the first diffusion region S1 and the memory gate electrode MG1 is not a region in which holes are generated during the erasing operation.

By forming the source/drain regions in the above process, the memory cell MC3 including the source region SR, the drain region DR, the control gate electrode CG1, and the memory gate electrode MG1 can be formed.

Next, as shown in FIG. 25, by performing the steps described with reference to FIGS. 18 to 20, the semiconductor device of the present embodiment including the memory cell MC3 is substantially completed. The memory cell MC3 differs from the memory cell MC2 of the modification of the first embodiment shown in FIG. 23 in that the second upper surface of the fin FA exposed from the control gate electrode CG1, the memory gate electrode MG1, and the ONO film C1 and in which a part of the source region SR is formed is located at the same height as the first upper surface of the fin FA directly below the memory gate electrode MG1. In addition, unlike the memory cell MC2, as described above, in the source region SR, a portion (the first diffusion region S1) formed at a position deeper than the upper surface of the fin FA is formed at a portion closer to the drain region DR side than a portion (the second diffusion region S2) formed at the upper surface of the fin FA. On the other hand, the source region SR is not formed on the first upper surface of the fin FA directly below the memory gate electrode MG1, and the memory cells MC2 and MC3 are the same in that the end portion of the source region SR closest to the drain region DR in the X direction are spaced apart from the first upper surface.

As described above, even if a step is not provided on the upper surface of the fin FA, the end portion of the source region SR on the drain region DR side can be spaced apart from the first upper surface of the fin FA directly below the memory gate electrode MG1 by devising the ion implantation method for forming the source region SR. Thus, the same effects as those of the first embodiment can be obtained. That is, by offsetting the upper surface of the end portion of the source region SR on the drain region DR side in the upper surface of the source region SR downward from the first upper surface, it is possible to prevent the current that flows mainly through the side surfaces of the fin FA on the control gate electrode CG1 side at the time of operation from concentrating on the top portion of the fin FA directly below the memory gate electrode MG1. Therefore, it is possible to prevent deterioration of rewrite durability caused by local injections of charges into the ONO film C1 in the vicinity of the first upper surface of the fin FA and deterioration of retention characteristics. Therefore, the number of rewritable times of the nonvolatile memory element can be increased, so that the performance of the semiconductor device can be improved.

In addition, since the manufacturing process of retracting the upper surface of the fin FA by a dry etching can be omitted, the generation of etching residues caused by a dry etching can be prevented. In other words, the manufacturing step of the semiconductor device can be simplified, and the reliability of the semiconductor device can be improved.

In the present embodiment, although the case where a step is not formed on the upper surface of the fin FA, unlike the case of the above-mentioned first embodiment, is described, the height of the upper surface of the fin FA in the region adjacent to the memory gate electrode MG1 may be lower than the first upper surface of the fin directly below the memory gate electrode MG1 due to, for example, the step of removing the ONO film C1 described with reference to FIG. 15 and the step of cleaning performed in the subsequent step.

Modification

In the present modification, in order to prevent the impurities in the source region formed by ion implantation from diffusing to the top portion of the fin directly below the memory gate electrode by heat treatment or the like, the formation of the diffusion preventing layer on the top portion of the fin will be described with reference to FIGS. 26 to 29. FIGS. 26-29 are cross-sectional view during the manufacturing step of semiconductor device, which is the modification of the present embodiment. Here, a showing of the interlayer insulating film IL3 and the wiring M1 (see FIG. 21) on the plug and the explanation of the forming process are omitted.

In the manufacturing step of the semiconductor device of the present modification, first, as shown in FIG. 26, a semiconductor substrate SB is prepared. Subsequently, an oxygen adsorption layer ML, which is a monoatomic layer, is formed on the upper surface of the semiconductor substrate SB by, for example, an Atomic Layer Deposition (ALD) method. The oxygen adsorption layer ML is an oxygen-containing layer formed of, for example, a silicon (Si) film and containing oxygen (O).

Figure 27:
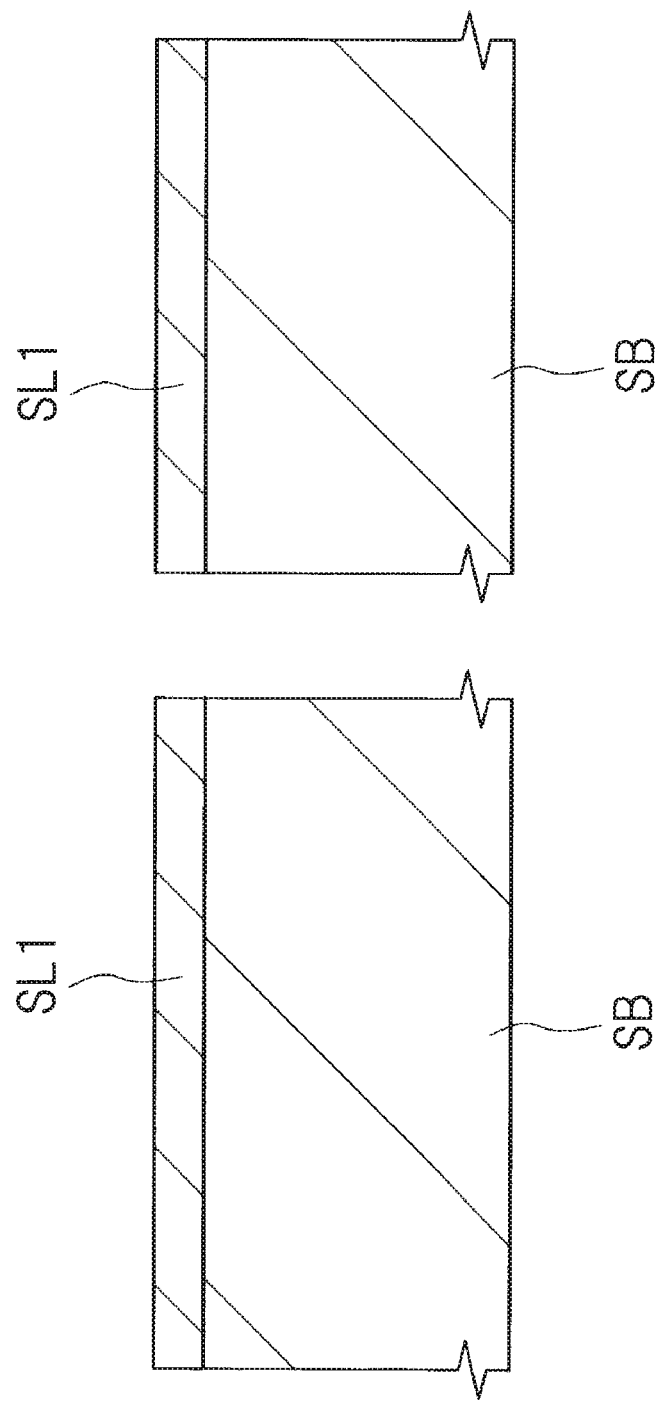
FIG. 27 is a cross-sectional view during the manufacturing step of the semiconductor device following FIG. 26.

Next, as shown in FIG. 27, a semiconducting layer SL1 as an epitaxial layer is formed on the oxygen adsorption layer ML by an epitaxial growth method. Since the oxygen adsorption layer ML is integrated with the semiconductor layer SL1, the oxygen adsorption layer ML is not shown in FIG. 27. Although the oxygen adsorption layer ML is a layer containing oxygen, since the oxygen adsorption layer ML is a monoatomic layer, epitaxial growth is not inhibited and the semiconductor layer SL1 can be formed. The thickness of the semiconductor layer SL1 is, for example, 5 nm to 10 nm. The semiconducting layer SL1 is an oxygen-containing layer and serves as a diffusion preventing layer.

Figure 28:
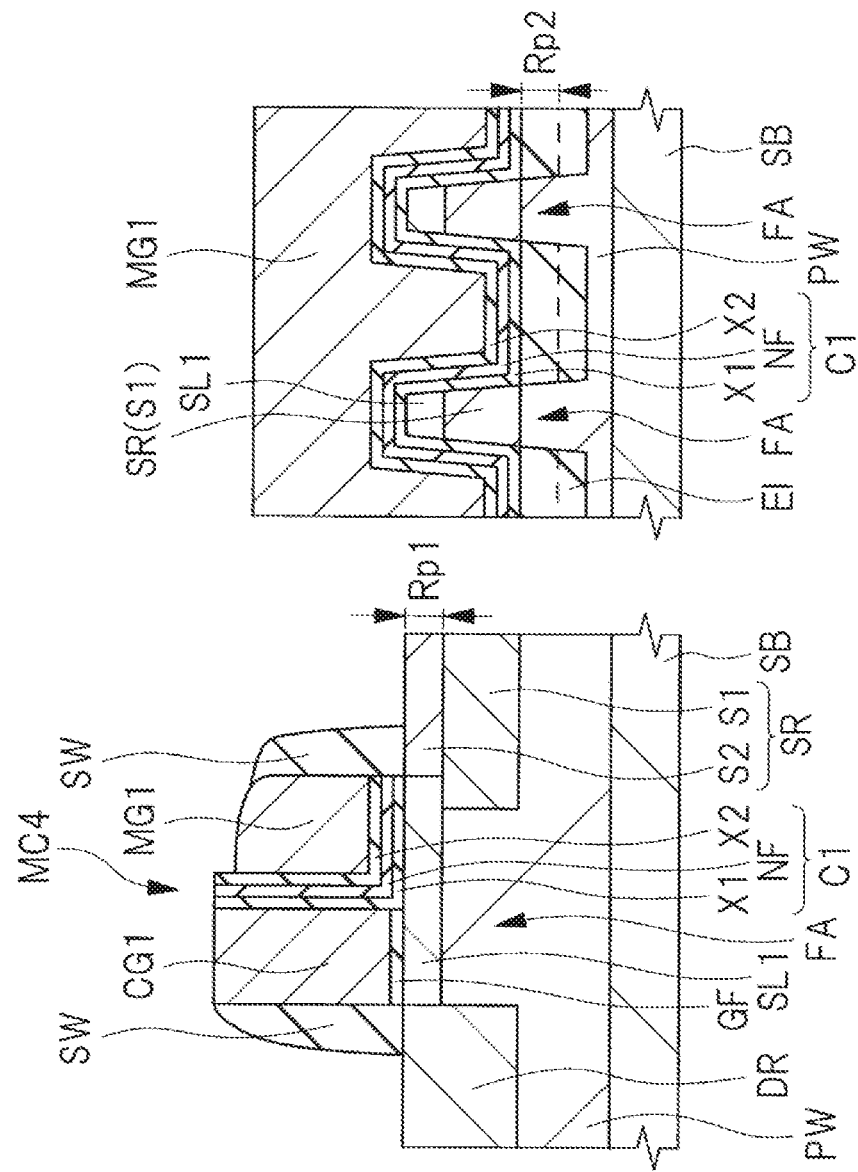
FIG. 28 is a cross-sectional view during the manufacturing step of the semiconductor device following FIG. 27.

Next, as shown in FIG. 28, a memory cell MC4 is formed on the fin FA by performing the step of forming the insulating films IF1 and IF2 described with reference to FIG. 7, the steps described with reference to FIGS. 8 to 15, and the step described with reference to FIG. 24. The memory cell MC4 is a nonvolatile memory element including a source region SR, a drain region DR, a control gate electrode CG1, and a memory gate electrode MG1. The source region SR is formed by a plurality of ion implantations or a diagonal ion implantation described with reference to FIG. 24.

Here, the fin FA is formed of a part of the semiconductor substrate SB and the semiconducting layer SL1 on the semiconductor substrate SB. That is, the upper end of the fin FA is formed of the semiconductor layer SL1 containing oxygen. A step is not formed on the upper surface of the fin FA. In the step described with reference to FIG. 24, the first diffusion region S1 is formed in the semiconductor substrate SB below the semiconductor layer SL1. That is, an end portion of the source region SR closest to the drain region DR in the X direction is formed below the semiconductor layer SL1. The second diffusion region S2 is formed from the upper surface of the semiconductor layer SL1 to the bottom surface of the semiconductor layer SL1. That is, the oxygen concentration in the fin FA above the first diffusion region S1 is higher than the oxygen concentration of the fin FA below the upper surface of the first diffusion region S1. That is, the oxygen concentration of the fin FA (semiconductor layer SL1) above the first diffusion region S1 and directly below the first upper surface of the fin FA directly below the memory gate electrode MG1 is higher than the oxygen concentration of the fin FA below the upper surface of the first diffusion region S1. FIG. 24 shows a structure in which the p-type well PW is formed below the semiconductor layer SL1, but the p-type well PW is also formed in the semiconductor layer SL1.

Subsequently, heat treatment (activation annealing) is performed to diffuse impurities introduced into the semiconductor layer such as the semiconductor substrate SB including inside of the fin FA. At this time, since the semiconductor layer SL1 serves as a barrier against impurities diffusion, the impurities contained in the source region SR protruding to the drain region DR side and below the semiconductor layer SL1 can be prevented from diffusing above the interface between the semiconductor layer SL1 and the semiconductor substrate SB. In other words, a part of the source region SR can be prevented from diffusing to the first upper surface side directly below the memory gate electrode MG1.

Figure 29:
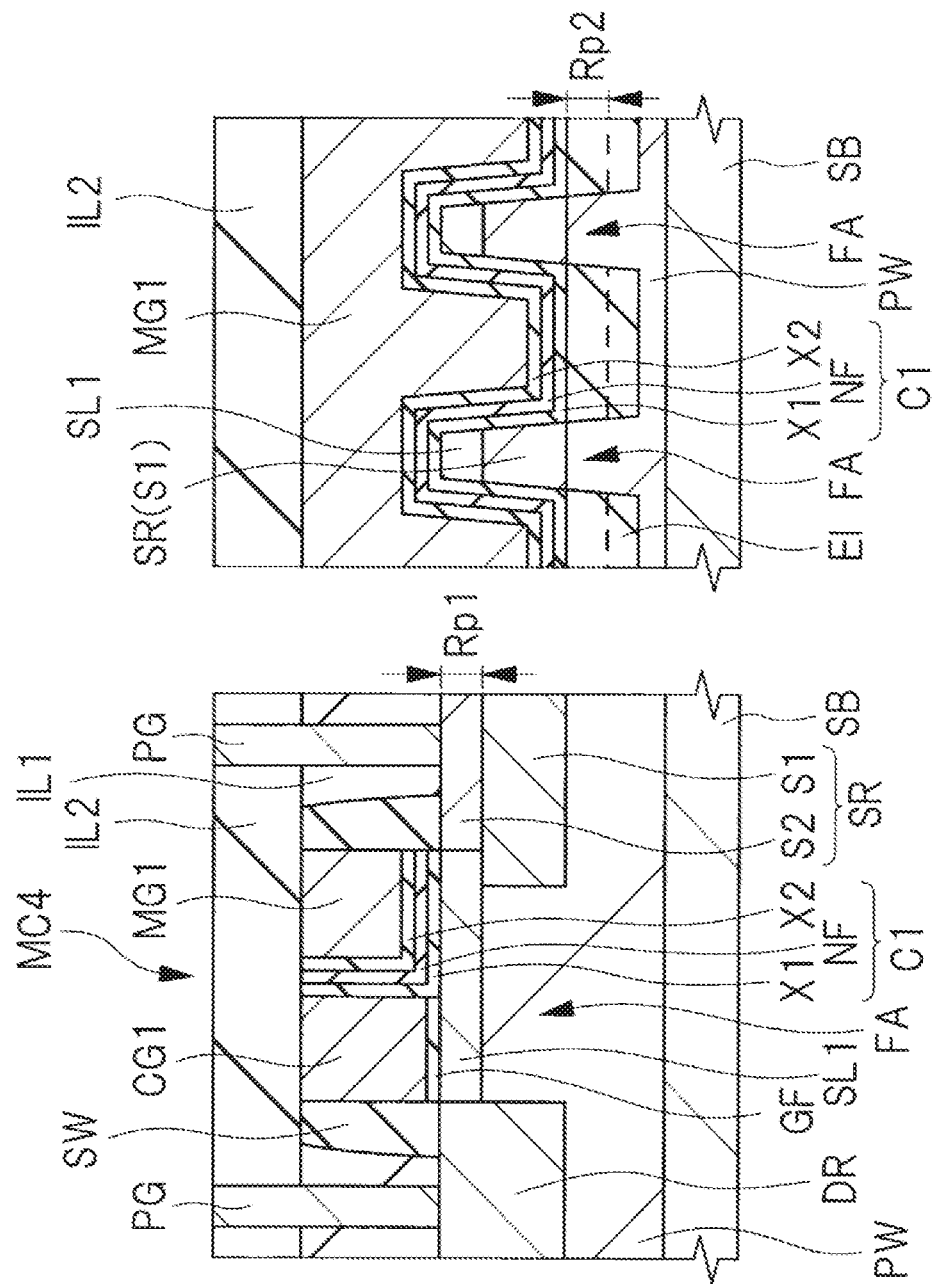
FIG. 29 is a cross-sectional view during the manufacturing step of the semiconductor device following FIG. 28.

Next, as shown in FIG. 29, the semiconductor device of the present modification including the memory cell MC4 is substantially completed by performing the steps described with reference to FIGS. 18 to 20.

In the present modification, in the implantation step described with reference to FIG. 24, even if a high concentration source region SR is formed at a depth away from the upper surface of the fin FA, and then impurities are diffused by performing heat treatment or the like, the impurity concentration of the top portion of the fin FA directly below the memory gate electrode MG1 can be kept low as described with reference to FIG. 28. Therefore, the end portion of the source region SR on the drain region DR side can be more reliably offset downward from the first upper surface. As a result, it is possible to prevent the current that flows mainly through the side surfaces of the fin FA on the control gate electrode CG1 side at the time of the operation from concentrating on the top portion of the fin FA directly below the memory gate electrode MG1. Therefore, it is possible to prevent deterioration of rewrite durability caused by local injections of charges into the ONO film C1 in the vicinity of the first upper surface of the fin FA and deterioration of retention characteristics. Therefore, the number of times of rewriting of the nonvolatile memory element can be increased, so that the performance of the semiconductor device can be improved.

Third Embodiment

In the present embodiment, the control gate electrode is formed after the memory gate electrode is formed, which will be described with reference to FIGS. 30 to 33. FIGS. 30 to 33 are cross-sectional view during the manufacturing step of the semiconductor device of the third embodiment. Here, a showing of the interlayer insulating film IL3 and the wiring M1 (see FIG. 21) on the plug and the explanation of the forming process are omitted.

In the manufacturing step of the semiconductor device of the present embodiment, first, the fin FA is formed by performing the same steps as the steps described with reference to FIGS. 7 and 8. It is assumed that the insulating films IF1 and IF2 shown in FIG. 8 are removed at the time of performing the step described with reference to FIG. 8, and the following explanation will be given.

Figure 30:
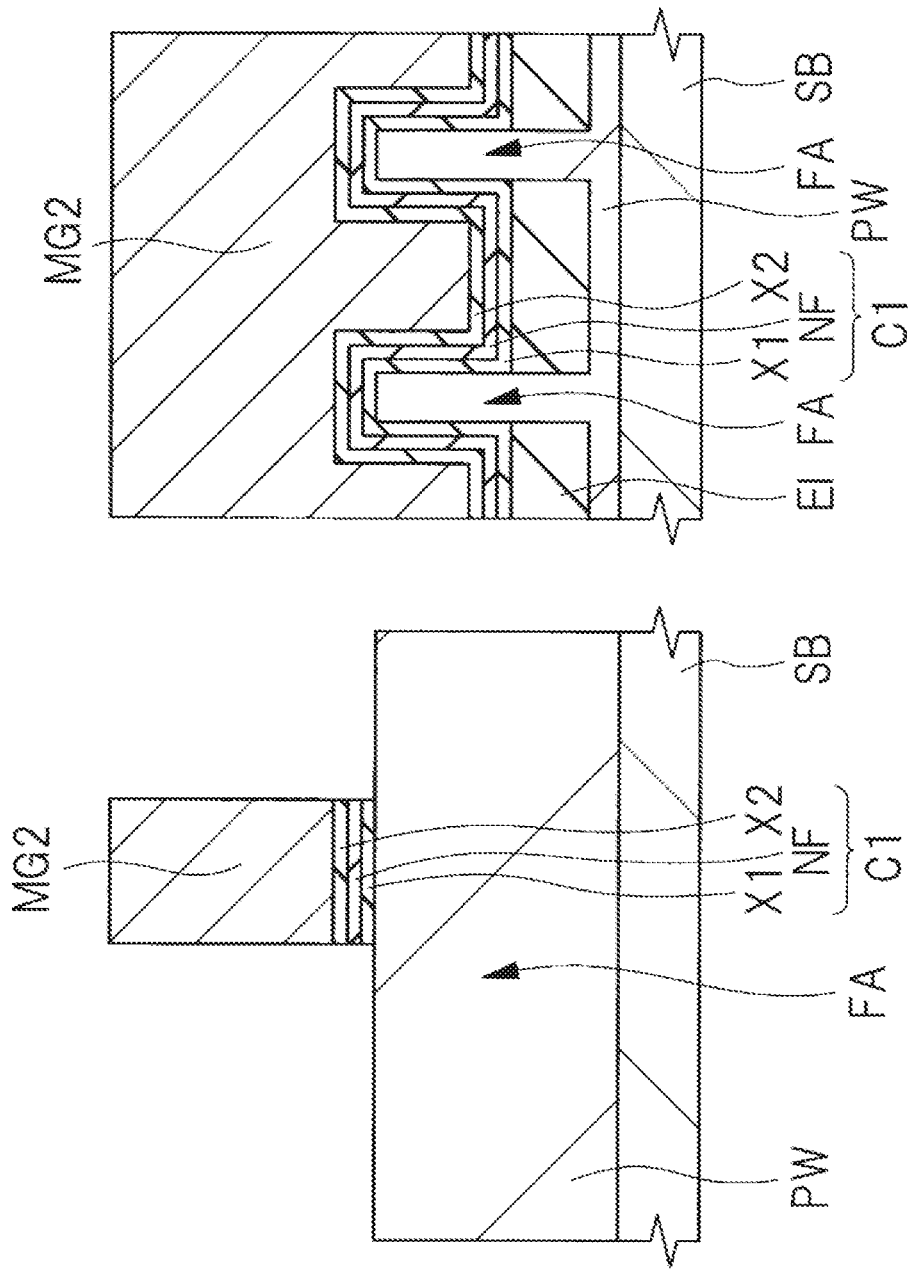
FIG. 30 is a cross-sectional view during the manufacturing step of a semiconductor device according to third embodiment.

Next, as shown in FIG. 30, an ONO film C1 and a polysilicon film are formed on the semiconductor substrate SB. The method of forming the ONO film C1 and the polysilicon film is the same as the method described with reference to FIG. 12. Subsequently, the polysilicon film and the ONO film C1 are patterned by photolithography and an etching method. As a result, a memory gate electrode MG2 formed of the polysilicon film is formed so as to straddle the fin FA via the ONO film C1. The stacked pattern formed of the ONO film C1 and the memory gate electrode MG2 extend in the Y direction.

Figure 31:
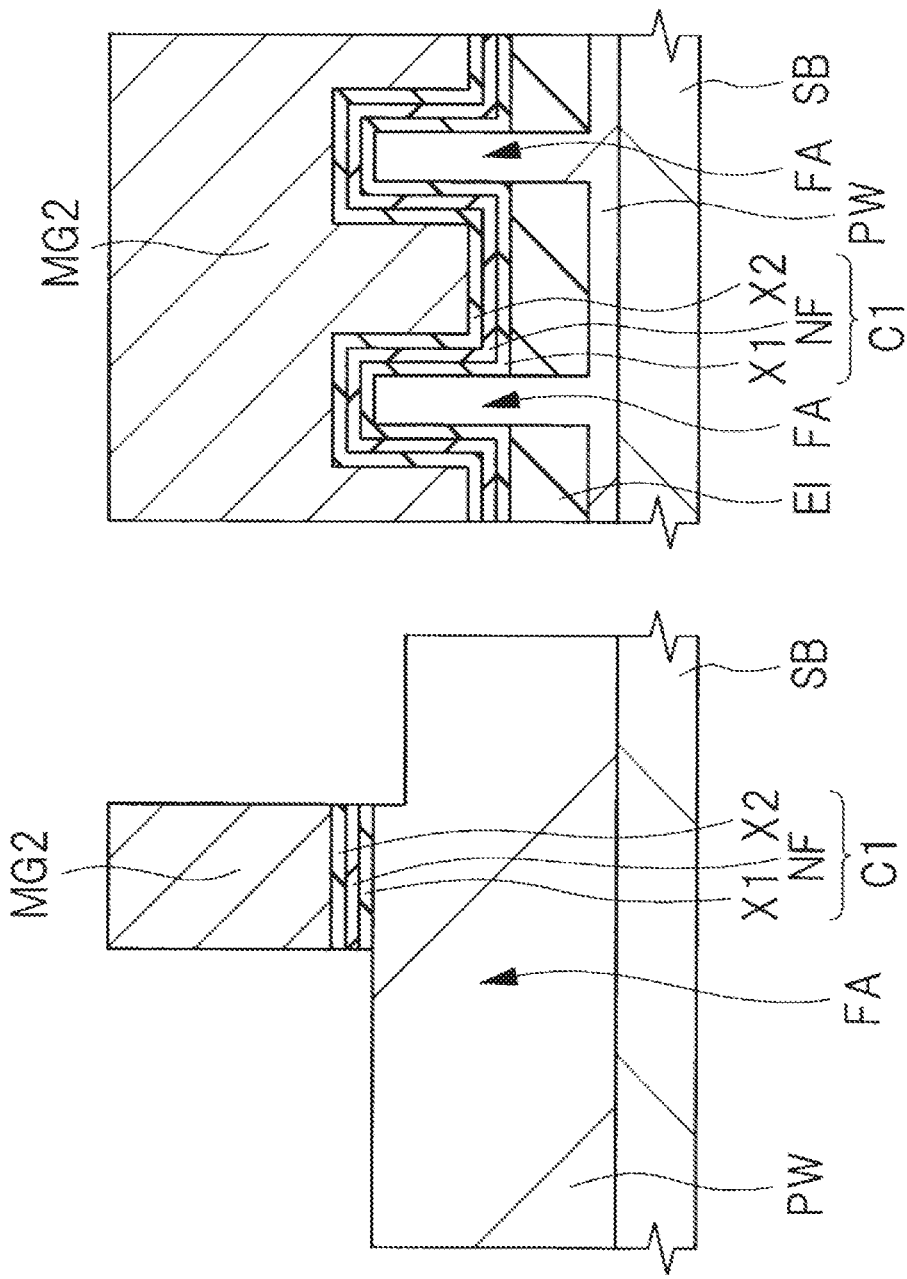
FIG. 31 is a cross-sectional view during the manufacturing step of the semiconductor device following FIG. 30.

Next, as shown in FIG. 31, one second upper surface of each of the upper surfaces of the fin FA adjacent to both sides of the memory gate electrode MG2 in the X direction is retracted by using photolithography and a dry etching method. That is, the same etching back as the step described with reference to FIG. 22 is performed. At this time, although it is considered that a part of the upper surface of the memory gate electrode MG2 is retracted, the showing thereof is omitted here.

Figure 32:
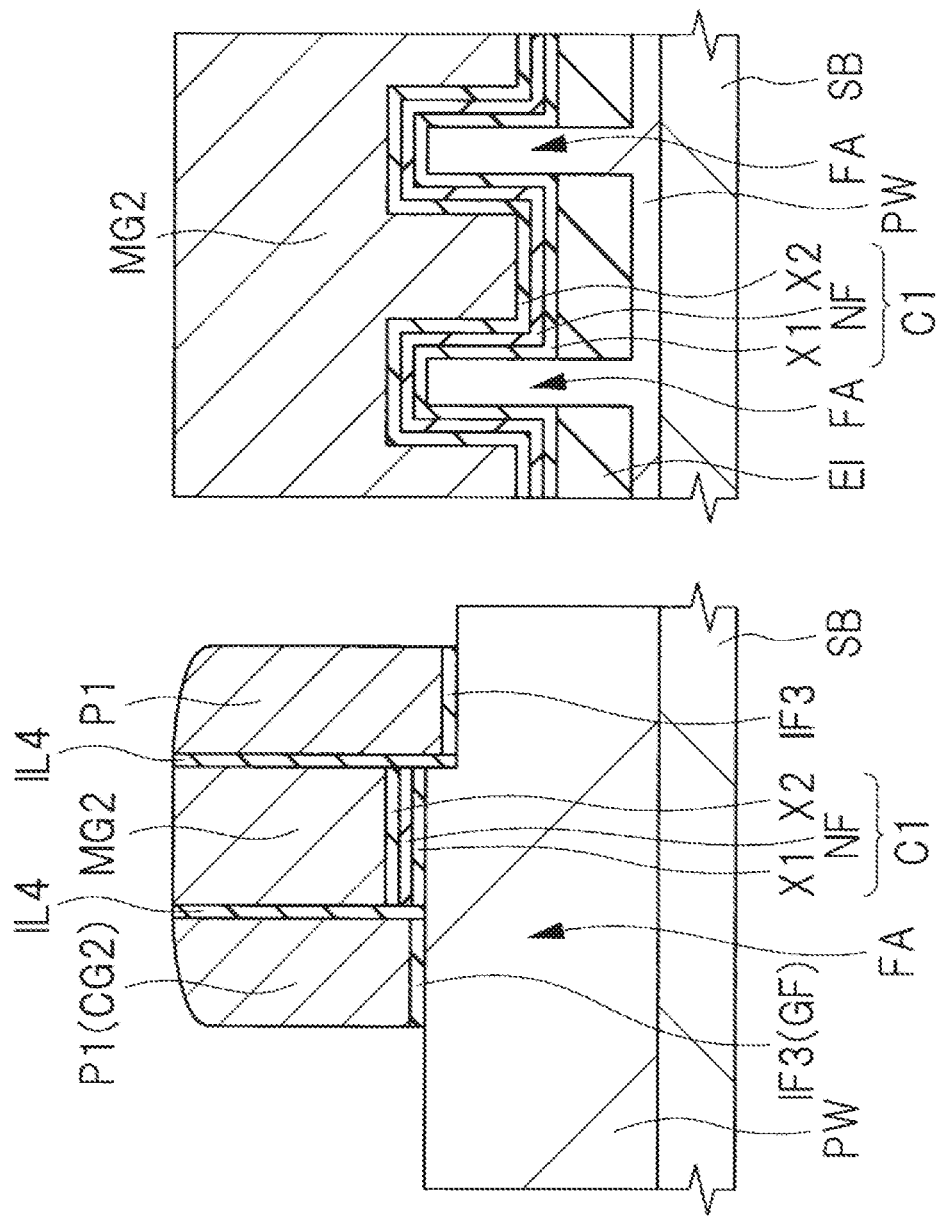
FIG. 32 is a cross-sectional view during the manufacturing step of the semiconductor device following FIG. 31.

Next, as shown in FIG. 32, an insulating film IF4 is formed on the semiconductor substrate SB by, for example, a CVD method. The thickness of the insulating film IF4 is 10 nm, for example. The insulating film IF4 is formed of, for example, a silicon oxide film, and is formed so as to cover the side surfaces and the upper surface of the memory gate electrode MG2 and the surface of the fin FA and the upper surface of the element isolation region EI. Subsequently, a dry etching is performed to expose the upper surface of the fin FA. That is, the insulating film IF4 covering the side surfaces of the fin FA and the side surfaces of the fin FA is left, and the other insulating film IF4 is removed. The insulating film IF4 covering the side surfaces of the fin FA is not shown.

Subsequently, an insulating film IF3 covering the fin FA is formed by, for example, thermal oxidization method. Thereafter, a polysilicon film P1 is formed on the semiconductor substrate SB by, for example, a CVD method, and then the upper surface of the fin FA is exposed from the polysilicon film P1 by performing a dry etching. As a result, the polysilicon film P1 in the form of sidewall spacers remains on both side surfaces of the memory gate electrode MG2 via the insulating film IF4. The polysilicon film P1 is formed on the fin FA via the insulating film IF3. Here, of the upper surfaces of the fin FA on the sides of the memory gate electrode MG2 in the X direction, the insulating film IF3 formed on the upper surface which is not retracted by the etching back described with reference to FIG. 31 constitutes the gate dielectric film GF. The polysilicon film P1 on the gate dielectric film GF constitutes a control gate electrode CG2.

Figure 33:
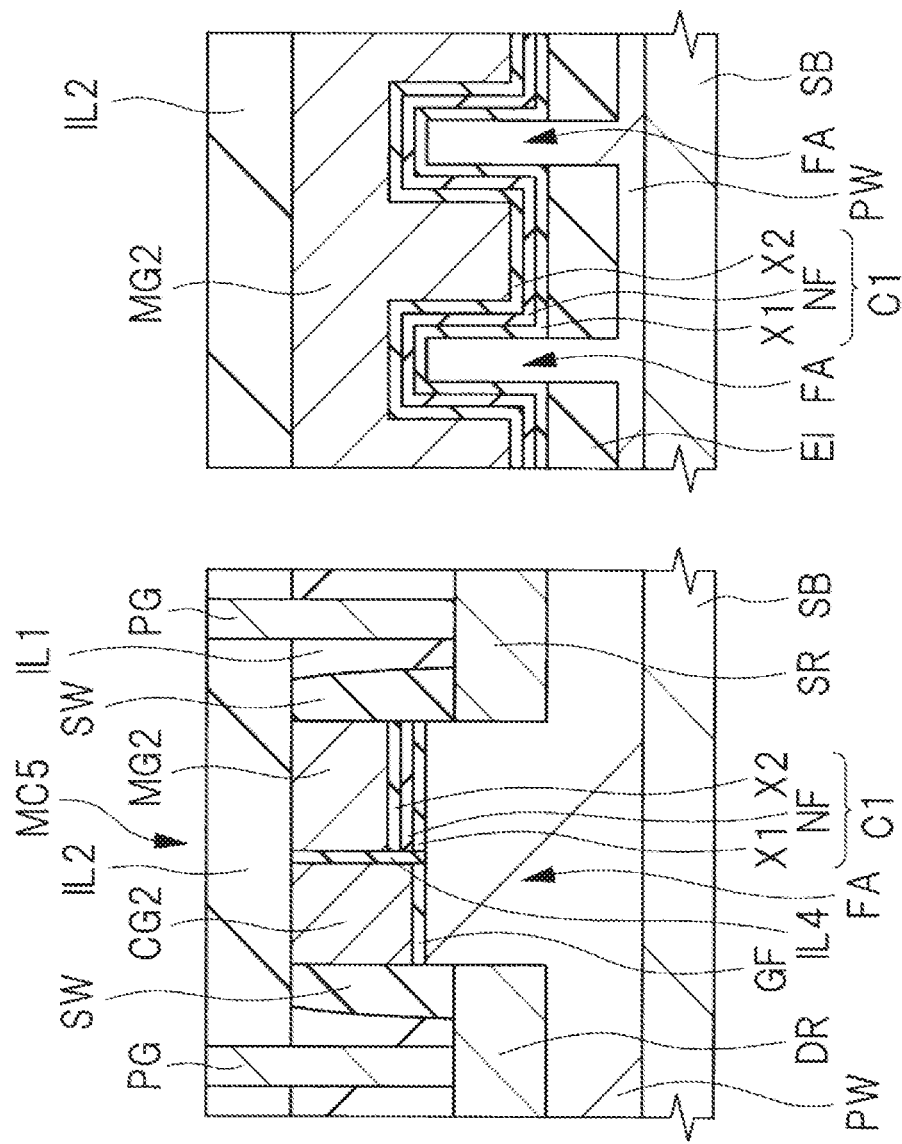
FIG. 33 is a cross-sectional view during the manufacturing step of the semiconductor device following FIG. 32.

Next, as shown in FIG. 33, by removing the insulating film IF3 and the polysilicon film P1 on the second upper surface of the fin FA, which is retracted by the etching back described with reference to FIG. 31, and the insulating film IF4 adjacent to the polysilicon film P1 by using photolithography and an etching method, the side surface of the memory gate electrode MG2 which is not adjacent to the control gate electrode CG2 is exposed.

Subsequently, by performing the steps described with reference to FIGS. 17 to 20, the sidewall spacers SW, the source region SR, the drain region DR, the interlayer insulating films IL1 and IL2, and the plugs PG are formed, whereby the semiconductor device of the present embodiment is substantially completed. Here, in the same manner as the step described with reference to FIG. 22, the source region SR is formed on the second upper surface of the fin FA retracted from the first upper surface of the fin FA directly below the memory gate electrode MG2, and the drain region DR is formed on the third upper surface of the fin FA located at the same height as the first upper surface. That is, the drain region DR is formed on the third upper surface and the side surfaces of the fin FA on the control gate electrode CG2 side, and the source region SR is formed on the second upper surface and the side surfaces of the fin FA on the memory gate electrode MG2 side. The source region SR, the drain region DR, the control gate electrode CG2, and the memory gate electrode MG2 constitute a memory cell MC5.

The structure of the semiconductor device of the present embodiment differs from that of the memory cell MC2 shown in FIG. 23 in that the insulating film interposed between the control gate electrode CG2 and the memory gate electrode MG2 is not an ONO film but only a silicon oxide film, for example, but the other structure is the same as that of the memory cell MC2. That is, the present embodiment can obtain the same effects as the modification of the first embodiment.

Although the invention made by the present inventors has been specifically described based on the embodiments, the present invention is not limited to the embodiments, and it is needless to say that various modifications can be made without departing from the gist thereof.

In the first embodiment to the third embodiment, the ONO film is formed by stacking a silicon oxide film, a silicon nitride film, and a silicon oxide film in this order, but the ONO film may be a film formed by stacking a silicon oxide film, a hafnium oxide film (charge storage film), and an aluminum oxide film on a semiconductor substrate in this order, for example.

What is claimed is:

1. A semiconductor device, comprising:
    a semiconductor substrate;
    a protruding portion being a part of the semiconductor substrate, protruded from an upper surface of the semiconductor substrate and extending in a first direction, the protruding portion having side surfaces and an upper surface between the side surfaces;
    a control gate electrode formed on the upper surface and the side surfaces of the protruding portion via a first insulating film and extending in a second direction intersecting the first direction;
    a memory gate electrode formed on the upper surface and the side surfaces of the protruding portion via a second insulating film including a charge storage film, being adjacent to one side surface of the control gate electrode and extending in the second direction;
    an n-type first semiconductor region formed in the protruding portion and being adjacent to a side of the memory gate electrode; and
    an n-type second semiconductor region formed in the protruding portion and being adjacent to a side of the control gate electrode in plan view,
    wherein the control gate electrode and the memory gate electrode are isolated from each other,
    wherein the control gate electrode, the memory gate electrode, the first semiconductor region and the second semiconductor region constitute a nonvolatile memory element,
    wherein the upper surface of the protruding portion includes a first upper surface which is located under the memory gate electrode and a second upper surface which is located at the first semiconductor region, and
    wherein a distance between the memory gate electrode and an upper surface of the first semiconductor region is greater than a distance between the memory gate electrode and the first upper surface in a thickness direction of the semiconductor substrate.

2. The semiconductor device according to claim 1,
    wherein the second upper surface of the protruding portion on which the first semiconductor region is formed is lower than the first upper surface.

3. The semiconductor device according to claim 2,
    wherein the upper surface of the first semiconductor region is lower than an upper surface of the second semiconductor region.

4. The semiconductor device according to claim 2,
    wherein a third upper surface of the protruding portion on which the second semiconductor region is formed is lower than the first upper surface.

5. The semiconductor device according to claim 1,
wherein a part of the first semiconductor region is located directly below the first upper surface.

6. The semiconductor device according to claim 1, further comprising:
an n-type third semiconductor region formed in the protruding portion on the first semiconductor region and in contact with the first semiconductor region,
wherein an end portion of the first semiconductor region on the second semiconductor region side is closer to the second semiconductor region than an end portion of the third semiconductor region on the second semiconductor region side.

7. The semiconductor device according to claim 6,
wherein oxygen concentration of the protruding portion on the first semiconductor region and directly below the first upper surface is higher than oxygen concentration of the protruding portion below the upper surface of the first semiconductor region.

8. A method of manufacturing a semiconductor device, comprising:
(a) preparing a semiconductor substrate;
(b) forming a protruding portion being a part of the semiconductor substrate, protruded from an upper surface of the semiconductor substrate and extending in a first direction, the protruding portion having side surfaces and an upper surface between the side surfaces;
(c) forming a control gate electrode on the upper surface and the side surfaces of the protruding portion via a first insulating film and extending in a second direction intersecting the first direction;
(d) forming a memory gate electrode on the upper surface and the side surfaces of the protruding portion via a second insulating film including a charge storage film; and
(e) forming an n-type first semiconductor region in the protruding portion adjacent to a side of the memory gate electrode, and forming an n-type second semiconductor region in the protruding portion adjacent to a side of the control gate electrode in plan view,
wherein the control gate electrode and the memory gate electrode are adjacent to each other and isolated from each other,
wherein the control gate electrode, the memory gate electrode, the first semiconductor region and the second semiconductor region constitute a nonvolatile memory element,
wherein the upper surface of the protruding portion includes a first upper surface which is located under the memory gate electrode and a second upper surface which is located at the first semiconductor region, and
wherein a distance between the memory gate electrode and an upper surface of the first semiconductor region is greater than a distance between the memory gate electrode and the first upper surface in a thickness direction of the semiconductor substrate.

9. The method according to claim 8, further comprising:
(b1) after the (c) and the (d), before the (e), retracting the second upper surface of the protruding portion exposed from the control gate electrode, the memory gate electrode and the second insulating film adjacent to the memory gate electrode in plan view, below the first upper surface,
wherein in the (e), the first semiconductor region is formed in the protruding portion including the second upper surface, and the second semiconductor region is formed in the protruding portion including a third upper surface exposed from the control gate electrode, the memory gate electrode and the second insulating film adjacent to the control gate electrode in plan view.

10. The method according to claim 9, wherein in the (b1), the second upper surface is retracted in a state that the third upper surface is covered with a protective film.

11. The method according to claim 9,
wherein in the (b1), each of the second upper surface and the third upper surface is retracted below the first upper surface.

12. The method according to claim 8,
wherein the (e) comprises:
(e1) forming the first semiconductor region by performing an ion implantation from a diagonal direction to the second upper surface of the protruding portion exposed from the control gate electrode, the memory gate electrode and the second insulating film adjacent to the memory gate electrode in plan view; and
(e2) forming the second semiconductor region in the protruding portion including the third upper surface of the protruding portion exposed from the control gate electrode, the memory gate electrode and the second insulating film adjacent to the control gate electrode in plan view, and
wherein a part of the first semiconductor region is located directly below the first upper surface.

13. The method according to claim 8,
wherein the (e) comprises:
(e2) forming the second semiconductor region;
(e3) forming the first semiconductor region spaced downward from the upper surface of the protruding portion by performing an ion implantation; and
(e4) forming an n-type third semiconductor region in the protruding portion on the first semiconductor region and in contact with the first semiconductor region by performing an ion implantation, and
wherein an end portion of the first semiconductor region on the second semiconductor region side is closer to the second semiconductor region than an end portion of the third semiconductor region on the second semiconductor region side.

14. The method according to claim 13, further comprising:
(a1) after the (a), before the (b), forming an epitaxial layer having higher oxygen concentration than the semiconductor substrate on the semiconductor substrate,
wherein in the (b), the protruding portion including the part of the semiconductor substrate and the epitaxial layer formed on the part of the semiconductor substrate, and
wherein in the (e4), the first semiconductor region is formed in the protruding portion below the epitaxial layer.

15. The method according to claim 8,
wherein the (c) is performed after the (d).

* * * * *